(12) United States Patent
Kim et al.

(10) Patent No.: US 12,713,605 B2
(45) Date of Patent: Aug. 18, 2026

(54) SEMICONDUCTOR MEMORY DEVICE, METHOD FOR FABRICATING THE SAME AND ELECTRONIC SYSTEM INCLUDING THE SAME

(71) Applicant: Samsung Electronics Co., Ltd., Suwon-si (KR)

(72) Inventors: Jun Hyoung Kim, Suwon-si (KR); Ji Won Kim, Suwon-si (KR); Ah Reum Lee, Suwon-si (KR); Suk Kang Sung, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 398 days.

(21) Appl. No.: 18/355,718

(22) Filed: Jul. 20, 2023

(65) Prior Publication Data

US 2024/0179910 A1 May 30, 2024

(30) Foreign Application Priority Data

Nov. 24, 2022 (KR) ........................ 10-2022-0159141

(51) Int. Cl.
*H10B 43/27* (2023.01)
*H10B 80/00* (2026.01)
*H10W 90/00* (2026.01)

(52) U.S. Cl.
CPC ............. *H10B 43/27* (2023.02); *H10B 80/00* (2023.02); *H10W 90/00* (2026.01); *H10W 90/792* (2026.01)

(58) Field of Classification Search
CPC ..... H01L 24/08; H01L 25/0657; H01L 25/18; H01L 2224/08145; H01L 2924/1431;
(Continued)

(56) References Cited

U.S. PATENT DOCUMENTS 9,812,464 B1 * 11/2017 Hwang .................. H10B 43/35
10,199,326 B1 2/2019 Ohsaki
(Continued)

FOREIGN PATENT DOCUMENTS

KR 20200052497 A 5/2020
KR 10-2022-0053733 A 5/2022
KR 10-2022-0114818 A 8/2022

OTHER PUBLICATIONS

European Search Report issued in corresponding European Application No. 23206796.7 (mailed May 8, 2024).
(Continued)

*Primary Examiner* — Mamadou L Diallo
(74) *Attorney, Agent, or Firm* — Wolf, Greenfield & Sacks, P.C.

(57) ABSTRACT

A semiconductor memory device includes a cell substrate including a first surface and a second surface opposite to the first surface, a first mold stack including a plurality of first gate electrodes sequentially stacked on the first surface, a second mold stack including a plurality of second gate electrodes sequentially stacked on the first mold stack, a first channel structure extending in a first direction with respect to the first surface and crossing the plurality of first gate electrodes and the plurality of second gate electrodes, and an input/output pad on the second surface, wherein the first mold stack includes a mold opening that exposes a portion of the second mold stack, and at least a portion of the input/output pad overlaps the mold opening in the first direction.

20 Claims, 37 Drawing Sheets

(58) Field of Classification Search
CPC ... H01L 2924/14511; H01L 2224/0557; H01L 2224/05573; H01L 2224/06155; H01L 2225/06506; H01L 2225/0651; H10B 43/27; H10B 80/00; H10B 43/10; H10B 43/40; H10B 43/50; H10B 43/35; H10B 41/27; H10B 41/35; H10B 41/40; H10B 41/50
See application file for complete search history.

(56) References Cited

U.S. PATENT DOCUMENTS

| | | | | |
|---|---|---|---|---|
| 10,283,566 | B2 | 5/2019 | Sel et al. | |
| 10,354,987 | B1 | 7/2019 | Mushiga et al. | |
| 10,797,028 | B2 | 10/2020 | Liu et al. | |
| 10,937,766 | B2 | 3/2021 | Liu | |
| 2018/0350879 | A1* | 12/2018 | Sel | H01L 21/76831 |
| 2019/0088676 | A1 | 3/2019 | Tagami et al. | |
| 2021/0082897 | A1* | 3/2021 | Okada | H01L 24/09 |
| 2022/0130782 | A1* | 4/2022 | Ahn | H10B 41/50 |
| 2022/0254802 | A1 | 8/2022 | Kwon et al. | |
| 2022/0270992 | A1* | 8/2022 | Wada | H01L 24/80 |
| 2023/0147901 | A1* | 5/2023 | Park | H10B 41/35 257/314 |

OTHER PUBLICATIONS

Office Action issued in corresponding European Application No. 23206796.7 (mailed May 22, 2024).

* cited by examiner

SEMICONDUCTOR MEMORY DEVICE, METHOD FOR FABRICATING THE SAME AND ELECTRONIC SYSTEM INCLUDING THE SAME

CROSS-REFERENCE TO RELATED APPLICATION

This application claims priority from Korean Patent Application No. 10-2022-0159141 filed on Nov. 24, 2022, in the Korean Intellectual Property Office and all the benefits accruing therefrom under 35 U.S.C. 119, the contents of which in its entirety are herein incorporated by reference.

FIELD

The present disclosure relates to a semiconductor memory device, a method for fabricating the same and an electronic system including the same, and more particularly, to a semiconductor memory device comprising memory cells arranged three-dimensionally, a method for fabricating the same and an electronic system including the same.

BACKGROUND

As semiconductor memory devices capable of storing data of higher capacities may be required in electronic systems, methods capable of increasing data storage capacity of a semiconductor memory device have been studied. As one method capable of increasing data storage capacity of a semiconductor memory device, a semiconductor memory device comprising memory cells that are arranged three-dimensionally, instead of memory cells that are two-dimensionally, has been suggested.

SUMMARY

Embodiments of the present disclosure provide a semiconductor memory device that has improved degree of integration.

Embodiments of the present disclosure provide a method for fabricating a semiconductor memory device having improved degree of integration.

Other embodiments of the present disclosure provide an electronic system that includes a semiconductor memory device having improved degree of integration.

Embodiments of the present disclosure are not limited to those mentioned above and additional objects of the present disclosure, which are not mentioned herein, will be clearly understood by those skilled in the art from the following description.

According to aspects of the present disclosure, there is provided a semiconductor memory device comprising a cell substrate including a first surface and a second surface opposite to the first surface, a first mold stack including a plurality of first gate electrodes sequentially stacked on the first surface, a second mold stack including a plurality of second gate electrodes sequentially stacked on the first mold stack, a first channel structure extending in a first direction with respect to the first surface crossing the plurality of first gate electrodes and the plurality of second gate electrodes, and an input/output pad on the second surface, wherein the first mold stack includes a mold opening that exposes a portion of the second mold stack, and at least a portion of the input/output pad overlaps the mold opening in the first direction.

According to aspects of the present disclosure, there is provided a semiconductor memory device comprising a peripheral circuit structure, and a cell structure stacked on the peripheral circuit structure, wherein the cell structure includes a cell substrate including a first surface facing the peripheral circuit structure and a second surface opposite to the first surface, a first mold stack and a second mold stack, which are sequentially stacked on the first surface, each of the first mold stack and the second mold stack including a plurality of gate electrodes, a first channel structure extending in a first direction with respect to the first surface and passing through the first mold stack and the second mold stack, an input/output pad on the second surface, and a contact plug extending in the first direction to electrically connect the peripheral circuit structure with the input/output pad, wherein the first mold stack includes a mold opening that exposes a portion of the second mold stack, and wherein at least a portion of the input/output pad overlaps the mold opening in the first direction.

According to aspects of the present disclosure, there is provided a method for fabricating a semiconductor memory device, the method comprising forming a first pre-mold including a first mold insulating layer and a first mold sacrificial layer, which are alternately stacked, on a base substrate, removing a portion of the first pre-mold to form a mold opening that exposes at least a portion of the base substrate, forming a second pre-mold including a second mold insulating layer and a second mold sacrificial layer, which are alternately stacked, on the first pre-mold, forming a first channel structure passing through the first pre-mold and the second pre-mold, forming a cell substrate replacing the base substrate, the cell substrate including a first surface on which the first channel structure is disposed and a second surface opposite to the first surface, and forming an input/output pad on the second surface of the cell substrate, wherein at least a portion of the input/output pad overlaps the mold opening in a first direction crossing the first surface.

According to aspects of the present disclosure, there is provided an electronic system comprising a main board, a semiconductor memory device including a peripheral circuit structure and a cell structure, which are sequentially stacked, on the main board, and a controller electrically connected with the semiconductor memory device on the main board, wherein the cell structure includes a cell substrate including a first surface facing the peripheral circuit structure and a second surface opposite to the first surface, a first mold stack and a second mold stack, which are sequentially stacked on the first surface, each of the first mold stack and the second mold stack including a plurality of gate electrodes, a first channel structure extending in a first direction with respect to the first surface and passing through the first mold stack and the second mold stack, and an input/output pad electrically connected with the controller on the second surface, wherein the first mold stack includes a mold opening that exposes a portion of the second mold stack, and at least a portion of the input/output pad overlaps the mold opening in the first direction.

BRIEF DESCRIPTION OF THE DRAWINGS

The above and other aspects and features of the present inventive concept will become more apparent by describing in detail exemplary embodiments thereof with reference to the attached drawings, in which:

FIG. 7 is a partially exploded perspective view illustrating a semiconductor memory device according to FIGS. 4 and 5.

FIGS. 23, 24, 25, 26, 27, 28, 29, and 30 are views illustrating intermediate steps to describe a method for fabricating a semiconductor memory device according to some embodiments.

Figure 36:
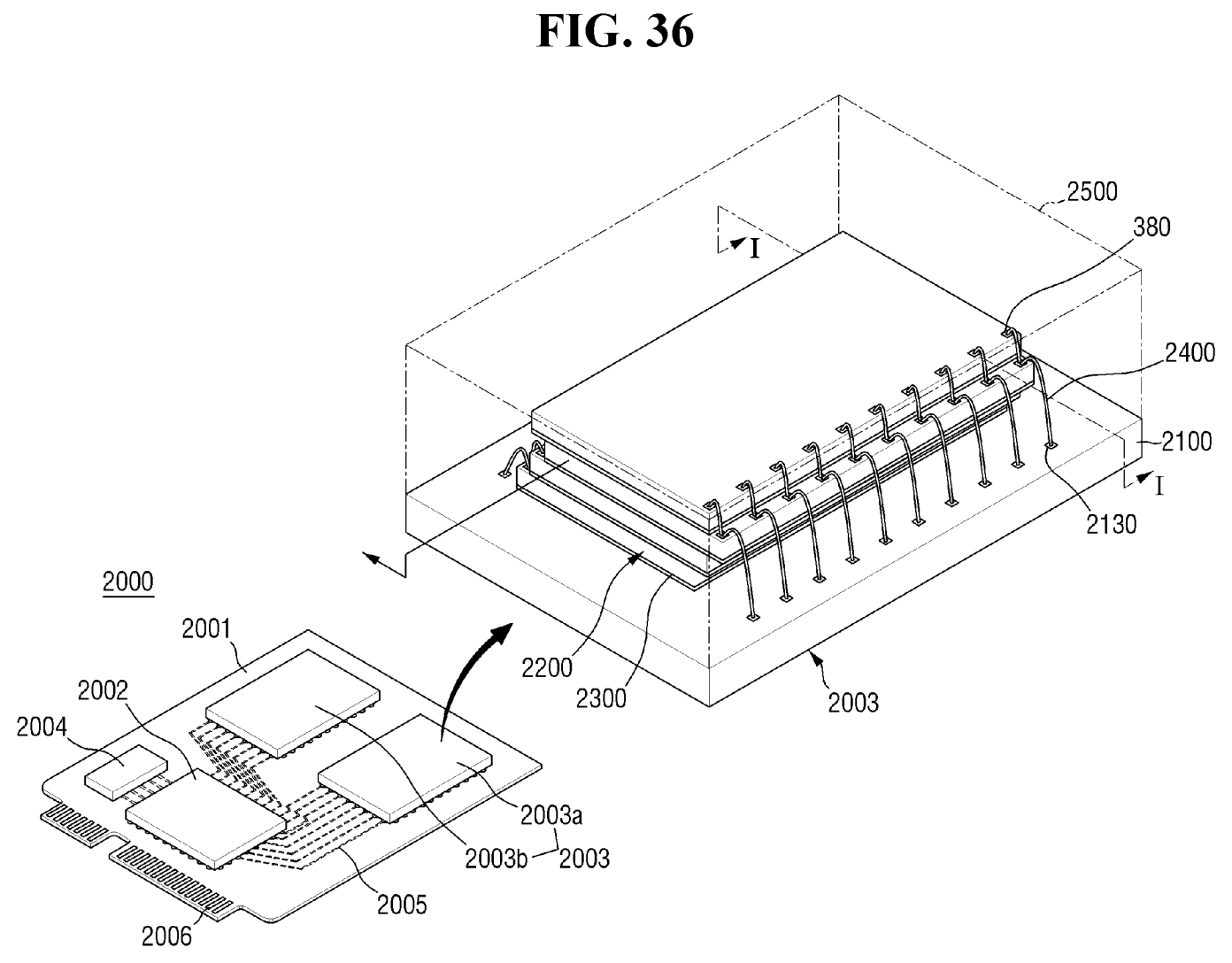

FIG. 36 is an exemplary perspective view illustrating an electronic system according to some embodiments.

DETAILED DESCRIPTION OF EMBODIMENTS

It will be understood that, although the terms "first," "second," etc. may be used herein to describe various elements or components, these elements or components should not be limited by these terms. These terms are only used to distinguish one element or component from another element or component. Therefore, a first element or component discussed below could be termed a second element or component without departing from the present disclosure. The terms "comprises," "comprising," "includes" and/or "including," when used herein, specify the presence of stated elements, but do not preclude the presence of additional elements. The term "and/or" includes any and all combinations of one or more of the associated listed items.

Hereinafter, a semiconductor memory device according to exemplary embodiments of the present disclosure will be described with reference to FIGS. 1 to 12.

Figure 1:
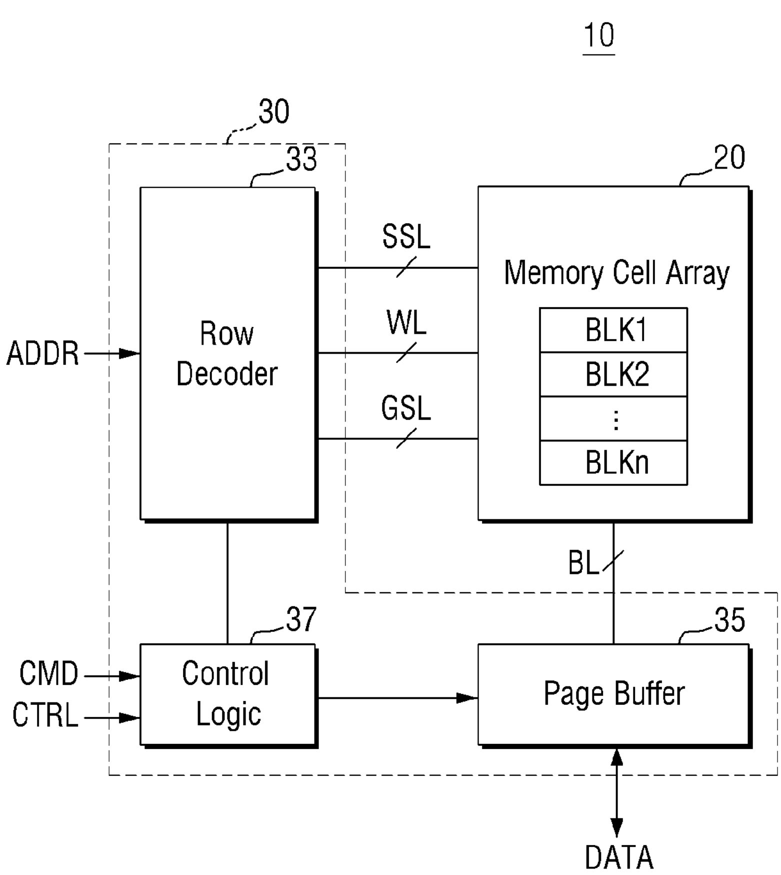
FIG. 1 is an exemplary block diagram illustrating a semiconductor memory device according to some embodiments.

FIG. 1 is an exemplary block diagram illustrating a semiconductor memory device according to some embodiments.

A memory cell array 20 may include a plurality of memory cell blocks BLK1 to BLKn. Each of the memory cell blocks BLK1 to BLKn may include a plurality of memory cells. The memory cell array 20 may be connected to a peripheral circuit 30 through a bit line BL, a word line WL, at least one string selection line SSL and at least one ground selection line GSL. In detail, the memory cell blocks BLK1 to BLKn may be connected to a row decoder 33 through the word line WL, the string selection line SSL and the ground selection line GSL. In addition, the memory cell blocks BLK1 to BLKn may be connected to a page buffer 35 through the bit line BL.

The peripheral circuit 30 may receive an address ADDR, a command CMD and a control signal CTRL from the outside of (e.g., from a device that is external to) a semiconductor memory device 10 and may transmit and receive data to and from an external device of the semiconductor memory device 10. The peripheral circuit 30 may include a control logic 37, the row decoder 33 and the page buffer 35. Although not shown, the peripheral circuit 30 may further include various sub-circuits such as an input/output circuit, a voltage generating circuit for generating various voltages required for an operation of the semiconductor memory device 10 and an error correction circuit for correcting an error of data DATA read from the memory cell array 20.

The control logic 37 may be connected to the row decoder 33, the input/output circuit and the voltage generating circuit. The control logic 37 may control the overall operation of the semiconductor memory device 10. The control logic 37 may generate various internal control signals used in the semiconductor memory device 10 in response to the control signal CTRL. For example, the control logic 37 may adjust a voltage level provided to the word line WL and the bit line BL when a memory operation such as a program operation or an erase operation is performed.

The row decoder 33 may select at least one of the plurality of memory cell blocks BLK1 to BLKn in response to the address ADDR, and may select at least one word line WL, at least one string selection line SSL and at least one ground selection line GSL of the selected memory cell blocks BLK1 to BLKn. In addition, the row decoder 33 may transmit a voltage for performing a memory operation to the word line WL of the selected memory cell blocks BLK1 to BLKn.

The page buffer 35 may be connected to the memory cell array 20 through the bit line BL. The page buffer 35 may operate as a write driver or a sense amplifier. In detail, when a program operation is performed, the page buffer 35 may operate as a write driver to apply a voltage according to the data DATA to be stored in the memory cell array 20, to the bit line BL. Meanwhile, when a read operation is performed, the page buffer 35 may operate as a sense amplifier to sense the data DATA stored in the memory cell array 20.

Figure 2:
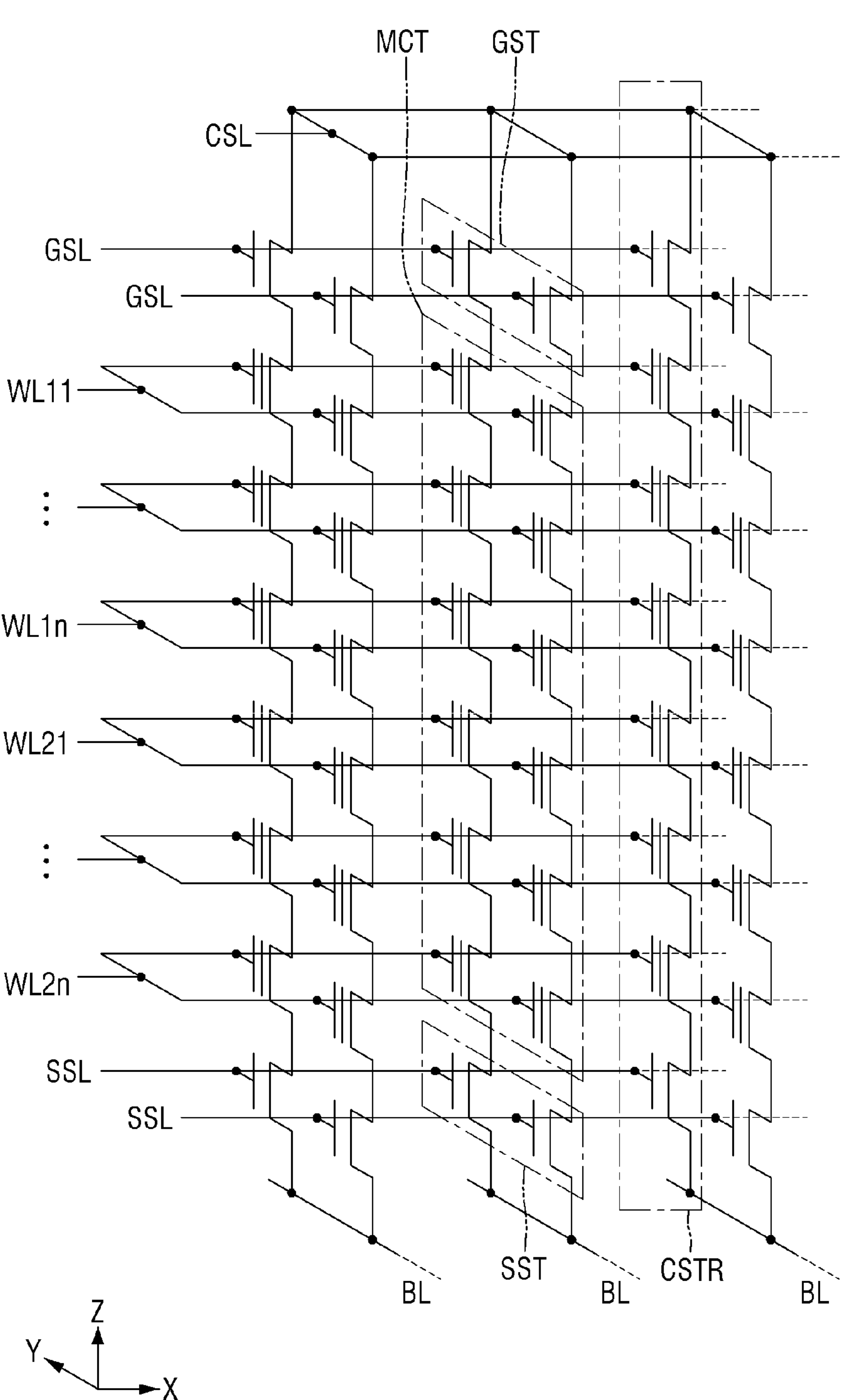
FIG. 2 is an exemplary circuit view illustrating a semiconductor memory device according to some embodiments.

FIG. 2 is an exemplary circuit view illustrating a semiconductor memory device according to some embodiments.

Referring to FIG. 2, a memory cell array (e.g., 20 in FIG. 1) of a semiconductor memory device according to some embodiments includes a common source line CSL, a plurality of bit lines BL and a plurality of cell strings CSTR.

The plurality of bit lines BL may be arranged two-dimensionally on a plane that includes a first direction X and a second direction Y. For example, the bit lines BL may extend in the second direction Y, and may be arranged to be spaced apart from each other in the first direction X. The plurality of cell strings CSTR may be connected to the respective bit lines BL in parallel. The cell strings CSTR may be commonly connected to the common source line CSL. That is, the plurality of cell strings CSTR may be disposed between the bit lines BL and the common source line CSL.

Each of the cell strings CSTR may include a ground selection transistor GST connected to the common source line CSL, a string selection transistor SST connected to the bit line BL and a plurality of memory cell transistors MCT disposed between the ground selection transistor GST and the string selection transistor SST. Each of the memory cell transistors MCT may include a data storage element. The ground selection transistor GST, the string selection transistor SST and the memory cell transistors MCT may be connected in series.

The common source line CSL may be commonly connected to sources of the ground selection transistors GST. In addition, the ground selection line GSL, a plurality of word lines WL11 to WL1*n* and WL21 to WL2*n* and the string selection line SSL may be disposed between the common source line CSL and the bit line BL. The ground selection line GSL may be used as a gate electrode of the ground selection transistor GST, the word lines WL11 to WL1*n* and WL21 to WL2*n* may be used as gate electrodes of the memory cell transistors MCT, and the string selection line SSL may be used as a gate electrode of the string selection transistor SST.

Figure 3:
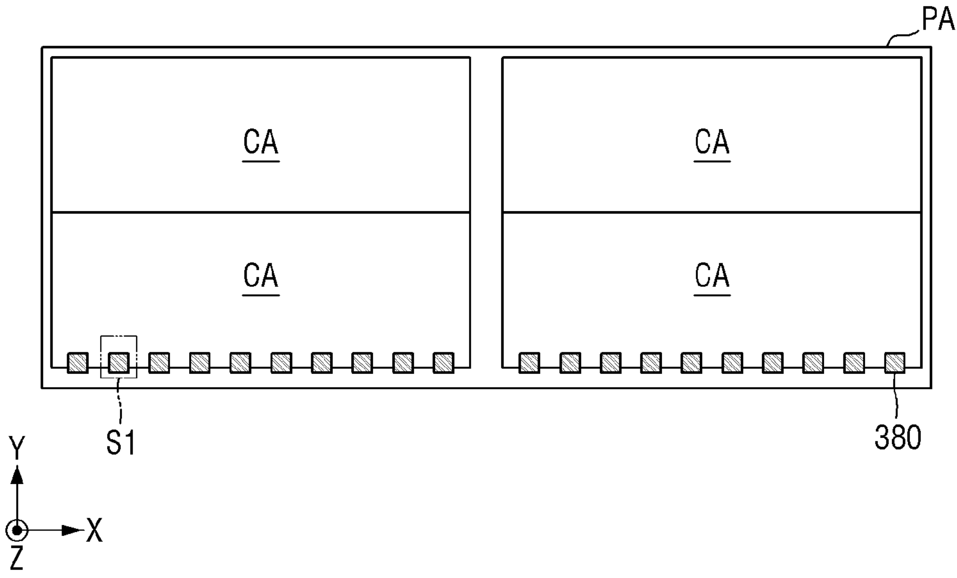
FIG. 3 is a schematic layout view illustrating a semiconductor memory device according to some embodiments.
Figure 4:
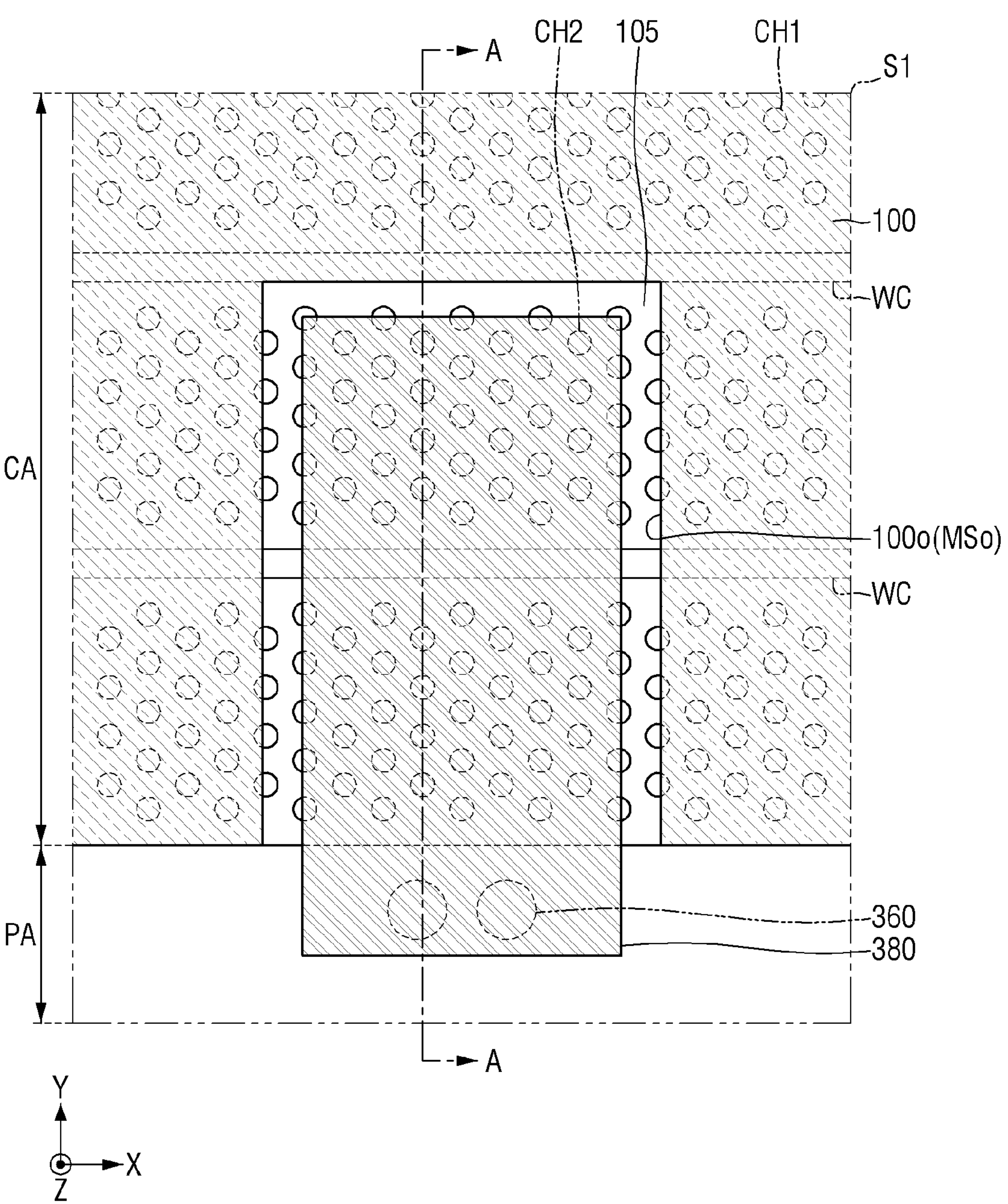
FIG. 4 is an exemplary layout view illustrating a region S1 of FIG. 3.
Figure 5:
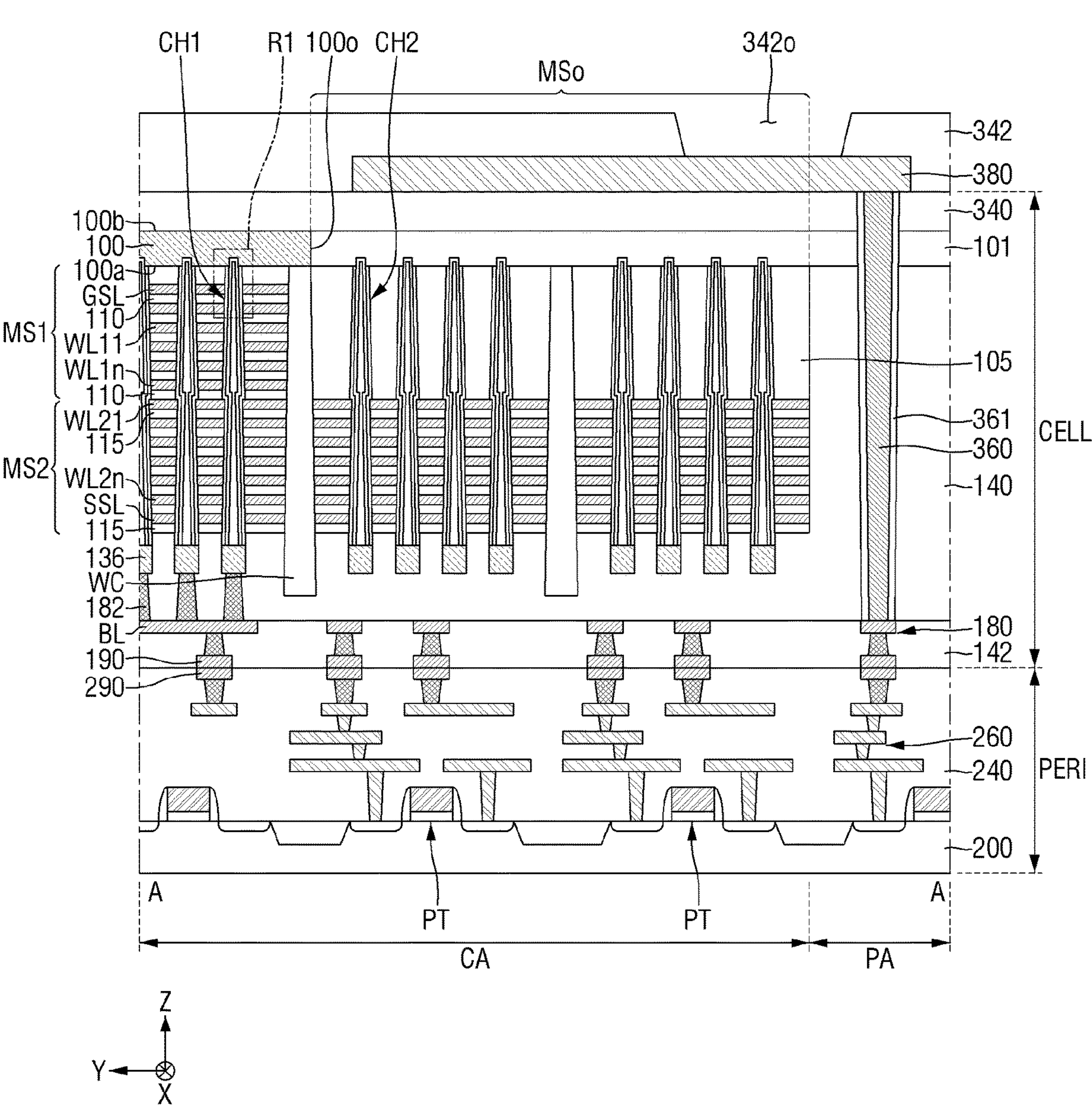
FIG. 5 is a cross-sectional view taken along line A-A of FIG. 4.
Figure 6:
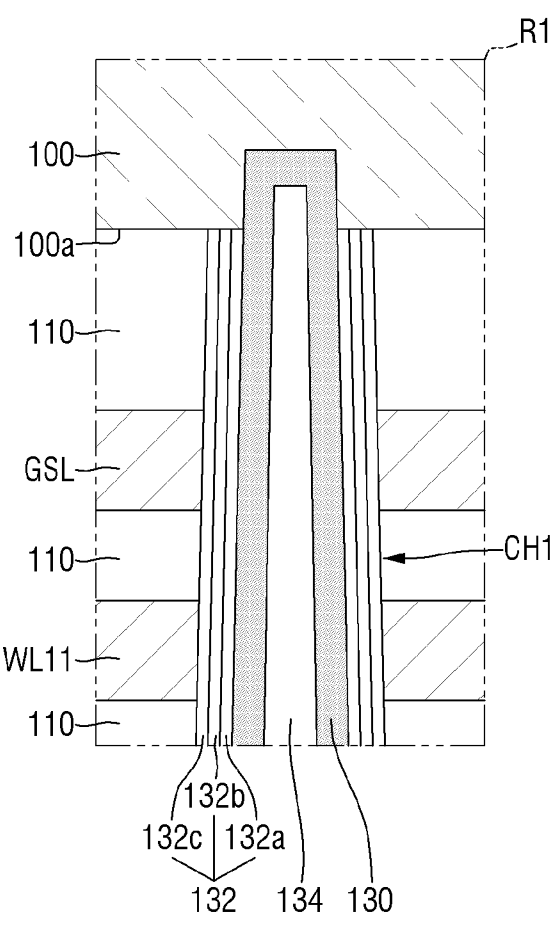
FIG. 6 is an enlarged view illustrating a region R1 of FIG. 5.
Figure 7:
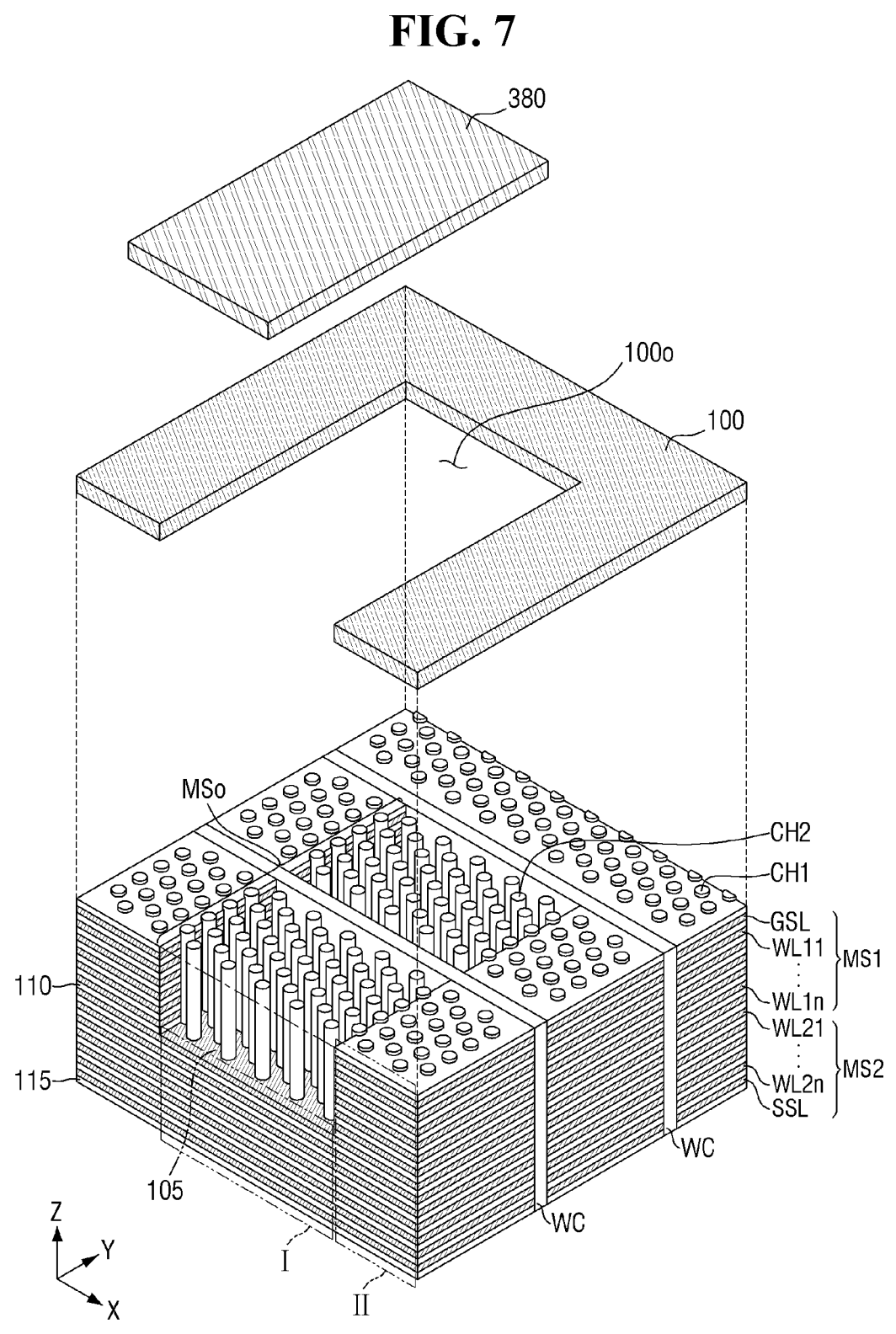

FIG. 3 is a schematic layout view illustrating a semiconductor memory device according to some embodiments. FIG. 4 is an exemplary layout view illustrating a region S1 of FIG. 3. FIG. 5 is a cross-sectional view taken along line A-A of FIG. 4. FIG. 6 is an enlarged view illustrating a region R1 of FIG. 5. FIG. 7 is a partially exploded perspective view illustrating a semiconductor memory device according to FIGS. 4 and 5.

Referring to FIGS. 3 to 7, the semiconductor memory device according to some embodiments includes a cell structure CELL, a peripheral circuit area PERI, and an input/output pad 380.

The cell structure CELL may include a cell array area CA and an outer area PA. A memory cell array (e.g., 20 in FIG. 1), which includes a plurality of memory cells, may be formed in the cell array area CA. For example, a first channel structure CH1, gate electrodes GSL, WL11 to WL1*n*, WL21 to WL2*n* and SSL and a bit line BL, which will be described below, may be disposed in the cell array area CA. The outer area PA may be a peripheral area surrounding the cell array area CA. In FIG. 3, four cell array areas CA are illustrated as being disposed in the outer area PA, but this is only exemplary, and the number and arrangement of the cell array areas CA are not limited to the illustrated example.

The cell structure CELL may include a cell substrate 100, an insulating substrate 101, mold structures MS1 and MS2, a filling material layer 105, a first interlayer insulating layer 140, a first channel structure CH1, a word line cutting region WC, a bit line BL and a cell wiring structure 180.

The cell substrate 100 may include, for example, a semiconductor substrate such as a silicon substrate, a germanium substrate or a silicon-germanium substrate. Alternatively, the cell substrate 100 may include a silicon-on-insulator (SOI) substrate or a germanium-on-insulator (GOI) substrate.

In the following description, a surface of the cell substrate 100 on which the memory cell array is disposed may be referred to as a first surface 100*a* or a front side. On the contrary, the surface of the cell substrate 100, which is opposite to the first surface 100*a* (or front side) of the cell substrate 100, may be referred to as a second surface 100*b* (or back side) of the cell substrate 100.

In some embodiments, the cell substrate 100 may include impurities. For example, the cell substrate 100 may include polysilicon (poly-Si) doped with impurities. For example, the cell substrate 100 may include poly-Si doped with N-type impurities (e.g., phosphorus (P) or arsenic (As)). The cell substrate 100 may be provided as a common source line (e.g., CSL in FIG. 2) of the semiconductor memory device according to some embodiments.

The insulating substrate 101 may be formed near (e.g., adjacent) the cell substrate 100. The insulating substrate 101 may form an insulating region near the cell substrate 100. The insulating substrate 101 may include, for example, at least one of silicon oxide, silicon nitride, silicon oxynitride or silicon carbide, but is not limited thereto.

An upper surface of the insulating substrate 101 is illustrated as being coplanar with a surface of the cell substrate 100, but this is only exemplary. As another example, the upper surface of the insulating substrate 101 may be lower or higher than that of the cell substrate 100. Spatially relative terms, such as "beneath," "below," "lower," "above," "upper," and the like, may be used herein to describe one element's or feature's relationship to another as illustrated in the figures, but are intended to encompass different orientations of the device in use or operation in addition to the orientation depicted in the figures. For example, if the device in the figures is turned over, elements described as "below" or "beneath" other elements or features would then be oriented "above" the other elements or features.

The mold structures MS1 and MS2 may be formed on the first surface 100*a* of the cell substrate 100. The mold structures MS1 and MS2 may include a plurality of gate electrodes GSL, WL11 to WL1*n*, WL21 to WL2*n* and SSL and a plurality of mold insulating layers 110 and 115, which are stacked on the cell substrate 100. Each of the gate electrodes GSL, WL11 to WL In, WL21 to WL2*n* and SSL and each of the mold insulating layers 110 and 115 may have a layered structure in which they extend in parallel with the first surface 100*a* of the cell substrate 100. The gate electrodes GSL, WL11 to WL1*n*, WL21 to WL2*n* and SSL may be sequentially stacked on the cell substrate 100 by being spaced apart from one another by the mold insulating layers 110 and 115.

In some embodiments, the mold structures MS1 and MS2 may include a plurality of stacks (e.g., a first mold stack MS1 and a second mold stack MS2) that are sequentially stacked on the cell substrate 100. Although only two stacks are illustrated as being stacked on the cell substrate 100, this is only for convenience of description and the number of stacks stacked on the cell substrate 100 may be three or more.

The first mold stack MS1 may include first gate electrodes GSL and WL11 to WL1*n* and first mold insulating layers 110, which are alternately stacked on the cell substrate 100. In some embodiments, the first gate electrodes GSL and WL11 to WL In may include a ground selection line GSL and a plurality of first word lines WL11 to WL1*n*, which are sequentially stacked on the cell substrate 100. The number and arrangement of the ground selection line GSL and the first word lines WL11 to WL In are only exemplary, and are not limited to the illustrated example.

The second mold stack MS2 may include second gate electrodes WL21 to WL2*n* and SSL and second mold insulating layers 115, which are alternately stacked on the first mold stack MS1. In some embodiments, the second gate electrodes WL21 to WL2*n* and SSL may include a plurality of second word lines WL21 to WL2*n* and a string selection line SSL, which are sequentially stacked on the first mold stack MS1. The number and arrangement of the second word lines WL21 to WL2*n* and the string selection line SSL are only exemplary, and are not limited to the illustrated example.

Each of the gate electrodes GSL, WL11 to WL1*n*, WL21 to WL2*n* and SSL may include a conductive material, for example, metal such as tungsten (W), molybdenum (Mo), ruthenium (Ru), cobalt (Co) and nickel (Ni), or a semiconductor material such as silicon, but is not limited thereto. For example, each of the gate electrodes GSL, WL11 to WL1*n*, WL21 to WL2*n* and SSL may include at least one of tungsten (W), molybdenum (Mo) or ruthenium (Ru). As another example, each of the gate electrodes GSL, WL11 to WL1*n*, WL21 to WL2*n* and SSL may include polysilicon.

Each of the mold insulating layers 110 and 115 may include at least one of an insulating material, for example, silicon oxide, silicon nitride or silicon oxynitride, but is not limited thereto.

The first mold stack MS1 may include a mold opening MSo. The mold opening MSo may expose a portion of the second mold stack MS2 in plan view. For example, as shown in FIGS. 4, 5 and 7, the mold opening MSo may extend in a third direction Z to pass through the first mold stack MS1, but may not pass or may not extend through the second mold stack MS2. The mold opening MSo may overlap a portion of the second mold stack MS2 in the third direction Z.

The mold opening MSo may be disposed to be adjacent to the outer area PA. In some embodiments, the mold opening MSo may extend from an edge of the cell array area. For example, one side of the mold opening MSo may be opened at the edge of the first mold stack MS1.

The filling material layer 105 may fill the mold opening MSo. That is, the filling material layer 105 may overlap a portion of the second mold stack MS2 in the third direction Z. The terms "fill," "cover," "surround," etc., as used herein may refer to either partially or completely filling, covering, or surrounding an element or space. The filling material layer 105 may include an insulating material, for example, at least one of silicon oxide, silicon nitride or silicon oxynitride, but is not limited thereto. For example, the filling material layer 105 may include silicon oxide. The filling material layer 105 may form an insulating region by replacing a portion of the first mold stack MS1.

In some embodiments, the cell substrate 100 may include a substrate opening 1000. The substrate opening 1000 may expose at least a portion of the mold opening MSo (or filling material layer 105) in plan view. For example, as shown in FIGS. 4, 5 and 7, the substrate opening 1000 may overlap the mold opening MSo (or filling material layer 105) in the third direction Z. The mold opening MSo and the substrate opening 1000 are illustrated as being fully overlapped with each other, but this is only exemplary. Components or layers described with reference to "overlap" in a particular direction may be at least partially obstructed by one another when viewed along a line extending in the particular direction or in a plane perpendicular to the particular direction. As another example, the substrate opening 1000 may be formed to be smaller than or greater than the mold opening MSo.

In some embodiments, a portion of the insulating substrate 101 may fill the substrate opening 1000. That is, a portion of the insulating substrate 101 may overlap at least a portion of the mold opening MSo or the filling material layer 105 in the third direction Z.

The first interlayer insulating layer 140 may be formed on the cell substrate 100 and/or the insulating substrate 101. In addition, the first interlayer insulating layer 140 may cover the mold structure MS1 and MS2. The first interlayer insulating layer 140 may include, for example, at least one of silicon oxide, silicon oxynitride or a low-k material having a dielectric constant lower than that of silicon oxide, but is not limited thereto.

The first channel structure CH1 may be disposed on the first surface 100*a* of the cell substrate 100. The first channel structure CH1 may extend in a vertical direction (hereinafter, referred to as the third direction Z) crossing the first surface 100*a* of the cell substrate 100 to pass through the mold structures MS1 and MS2. For example, the first channel structure CH1 may have a pillar shape (e.g., cylindrical shape) extending in the third direction Z. Therefore, the first channel structure CH1 may cross the plurality of gate electrodes GSL, WL11 to WL1*n*, WL21 to WL2*n* and SSL.

In some embodiments, the plurality of first channel structures CH1 may be arranged in a zigzag shape in plan view. For example, as shown in FIG. 4, the first channel structures CH1 may be alternately arranged in the first direction X and the second direction Y. The first channel structures CH1 may more improve the degree of integration of the semiconductor memory device. The number and arrangement of the first channel structures CH1 are only exemplary, and are not limited to the illustrated example. In some other embodiments, the plurality of first channel structures CH1 may be arranged in a honeycomb shape in plan view.

In some embodiments, the first channel structure CH1 may have a step difference between the first mold stack MS1 and the second mold stack MS2. For example, as shown in FIG. 5, a side of the first channel structure CH1 may have a bending portion (e.g., a non-planar or stepped portion) at a boundary between the first mold stack MS1 and the second mold stack MS2.

As shown in FIG. 6, each of the first channel structures CH1 may include a semiconductor pattern 130 and an information storage layer 132.

The semiconductor pattern 130 may extend in the third direction Z to cross the plurality of gate electrodes GSL, WL11 to WL1*n*, WL21 to WL2*n* and SSL. Although the semiconductor pattern 130 is illustrated in the form of a cup, it is only exemplary. For example, the semiconductor pattern 130 may have various shapes such as a cylindrical shape, a rectangular container shape, and a fully filled filler shape. The semiconductor pattern 130 may include, for example, a semiconductor material such as monocrystalline silicon, polycrystalline silicon, an organic semiconductor and a carbon nanostructure, but is not limited thereto.

In some embodiments, the semiconductor pattern 130 may be connected to the cell substrate 100. The term "connected" may be used herein to refer to a physical and/or electrical connection. For example, one end (e.g., upper end) of the semiconductor pattern 130 may be exposed from the information storage layer 132 and thus connected to the cell substrate 100. In some embodiments, the semiconductor pattern 130 may pass through the first surface 100*a* of the cell substrate 100. For example, one end (e.g., upper end) of the semiconductor pattern 130 may protrude into the cell substrate 100 beyond the information storage layer 132. The semiconductor pattern 130 may improve contact resistance by improving a contact area with the cell substrate 100.

The information storage layer 132 may be interposed between the semiconductor pattern 130 and each of the gate electrodes GSL, WL11 to WL1*n*, WL21 to WL2*n* and SSL. For example, the information storage layer 132 may extend along an outer side of the semiconductor pattern 130. The information storage layer 132 may include, for example, at least one of silicon oxide, silicon nitride, silicon oxynitride or a high-k material having a dielectric constant higher than that of silicon oxide. The high-k material may include, for example, at least one of aluminum oxide, hafnium oxide, lanthanum oxide, tantalum oxide, titanium oxide, lanthanum hafnium oxide, lanthanum aluminum oxide, dysprosium scandium oxide, or their combination.

In some embodiments, the information storage layer 132 may be formed of a multi-layer. For example, as shown in FIG. 5, the information storage layer 132 may include a tunnel insulating layer 132*a*, a charge storage layer 132*b* and a blocking insulating layer 132*c*, which are sequentially stacked on the outer side of the semiconductor pattern 130.

The tunnel insulating layer 132*a* may include, for example, silicon oxide, or a high-k material (e.g., aluminum oxide ($Al_2O_3$), hafnium oxide ($HfO_2$)) having a dielectric constant higher than that of silicon oxide. The charge storage layer 132*b* may include, for example, silicon nitride. The blocking insulating layer 132*c* may include, for example, silicon oxide, or a high-k material (e.g., aluminum oxide ($Al_2O_3$), hafnium oxide ($HfO_2$)) having a dielectric constant higher than that of silicon oxide.

In some embodiments, the first channel structure CH1 may further include a filling insulating layer 134. The filling insulating layer 134 may be formed to fill the inside of the semiconductor pattern 130 having a cup shape. The filling insulating layer 134 may include an insulating material, for example, silicon oxide, but is not limited thereto.

In some embodiments, the first channel structure CH1 may further include a channel pad 136. The channel pad 136 may be formed to be connected to the other end (e.g., lower end) of the semiconductor pattern 130. The channel pad 136 may include, for example, polysilicon doped with impurities, or metal, but is not limited thereto.

In some embodiments, a second channel structure CH2 may be further disposed. The second channel structure CH2 may extend in the third direction Z to pass through the mold opening MSo and the second mold stack MS2. The second channel structure CH2 may be formed in a shape similar to that of the first channel structure CH1, whereby stress applied from an area in which the mold opening MSo (or filling material layer 105) is formed may be reduced.

In some embodiments, the second channel structure CH2 may be formed at the same level as that of the first channel structure CH1. In the present disclosure, the expression "formed at the same level" refers to being formed by the same manufacturing process. For example, the second channel structure CH2 may include a semiconductor pattern 130, an information storage layer 132, a filling insulating layer 134 and a channel pad 136.

The word line cutting region WC may extend in the first direction X to cut (e.g., extend through or separate portions of) the mold structures MS1 and MS2. The mold structures MS1 and MS2 may be divided by the word line cutting regions WC to form a plurality of memory cell blocks (e.g., BLK1 to BLKn in FIG. 1). The word line cutting region WC may include an insulating material, for example, at least one of silicon oxide, silicon nitride or silicon oxynitride, but is not limited thereto.

The plurality of word line cutting regions WC may be two-dimensionally arranged on a plane that includes the first direction X and the second direction Y. For example, each of the word line cutting regions WC may extend in the first direction X, and may be arranged along the second direction Y by being spaced apart from each other.

In some embodiments, at least a portion of the word line cutting regions WC may cut the mold opening MSo (or filling material layer 105).

The bit line BL may be formed on the mold structures MS1 and MS2. The bit line BL may extend in the second direction Y and thus may be connected to the plurality of first channel structures CH1 arranged along the second direction Y. For example, a bit line contact 182 connected to the channel pad 136 may be formed in the first interlayer insulating layer 140. The bit line BL may be electrically connected to the first channel structures CH1 through the bit line contact 182.

The plurality of bit lines BL may be two-dimensionally arranged on a plane that includes the first direction X and the second direction Y. For example, the bit lines BL may extend in the second direction Y, and may be arranged along the first direction X by being spaced apart from each other.

In some embodiments, the bit line BL may be interposed between the first channel structure CH1 and the peripheral circuit structure PERI.

The cell wiring structure 180 may be formed on the mold structures MS1 and MS2. For example, a first inter-wiring insulating layer 142 may be formed on the first interlayer insulating layer 140, and the cell wiring structure 180 may be formed in the first inter-wiring insulating layer 142.

The cell wiring structure 180 may be electrically connected to a plurality of memory cells formed in the cell array area CA. For example, the cell wiring structure 180 may be electrically connected to the bit lines BL. Therefore, the cell wiring structure 180 may be electrically connected to the first channel structure CH1. In addition, although not shown in detail, the cell wiring structure 180 may be electrically connected to the gate electrodes GSL, WL11 to WL1*n*, WL21 to WL2*n* and SSL. For example, a plurality of gate contacts (not shown) extending in the third direction Z and connected to the corresponding gate electrodes GSL, WL11 to WL1*n*, WL21 to WL2*n* and SSL may be formed in the first interlayer insulating layer 140. The cell wiring structure 180 may be electrically connected to the gate contacts. The number and arrangement of the illustrated cell wiring structures 180 are only exemplary, and are not limited thereto.

In some embodiments, the cell wiring structure 180 may be electrically connected to the cell substrate 100. For example, a source contact (not shown) extending in the third direction Z and connected to the cell substrate 100 may be formed in the first interlayer insulating layer 140. The cell wiring structure 180 may be electrically connected to the source contact.

The peripheral circuit structure PERI may include a peripheral circuit substrate 200, a peripheral circuit element PT and a peripheral circuit wiring structure 260.

The peripheral circuit substrate 200 may include, for example, a semiconductor substrate such as a silicon substrate, a germanium substrate or a silicon-germanium substrate. Alternatively, the peripheral circuit substrate 200 may include a silicon-on-insulator (SOI) substrate or a germanium-on-insulator (GOI) substrate.

The peripheral circuit element PT may be formed on the peripheral circuit substrate 200. The peripheral circuit element PT may constitute a peripheral circuit (e.g., 30 in FIG. 1) that controls the operation of the semiconductor memory device. For example, the peripheral circuit element PT may include a control logic (e.g., 37 in FIG. 1), a row decoder (e.g., 33 in FIG. 1) and a page buffer (e.g., 35 in FIG. 1). In the following description, a surface of the peripheral circuit substrate 200, on which the peripheral circuit element PT is disposed, may be referred to as a front side of the peripheral circuit substrate 200. On the contrary, a surface of the peripheral circuit substrate 200, which is opposite to the front side of the peripheral circuit substrate 200, may be referred to as a back side of the peripheral circuit substrate 200.

The peripheral circuit element PT may include, for example, a transistor, but is not limited thereto. For example, the peripheral circuit element PT may include various passive elements such as a capacitor, a resistor and an inductor as well as various active elements such as a transistor.

The peripheral circuit wiring structure 260 may be formed on the peripheral circuit element PT. For example, a second inter-wiring insulating layer 240 may be formed on the front side of the peripheral circuit substrate 200, and the peripheral circuit wiring structure 260 may be formed in the second inter-wiring insulating layer 240. The peripheral circuit wiring structure 260 may be electrically connected to the peripheral circuit element PT. The number and arrangement of the illustrated peripheral circuit wiring structures 260 are only exemplary, and are not limited thereto.

In some embodiments, the cell structure CELL may be stacked on the peripheral circuit structure PERI. For example, the cell structure CELL may be stacked on the second inter-wiring insulating layer 240.

In some embodiments, the first surface 100*a* of the cell substrate 100 may face the peripheral circuit structure PERI. For example, the front side (i.e., the first surface 100*a*) of the cell substrate 100 may face the front side of the peripheral circuit substrate 200.

The semiconductor memory device according to some embodiments may have a chip to chip (C2C) structure. The C2C structure means that an upper chip, which includes the cell structure CELL, is manufactured on a first wafer (e.g., the cell substrate 100), a lower chip, which includes the peripheral circuit structure PERI, is manufactured on a second wafer (e.g., the peripheral circuit substrate 200) different from the first wafer and then the upper chip and the lower chip are connected to each other by a bonding method.

As an example, the bonding method may mean that a first bonding metal 190 formed on the uppermost metal layer of the upper chip and a second bonding metal 290 formed on the uppermost metal layer of the lower chip are electrically connected to each other along an interface therebetween (which may be referred to as a bonding interface). For example, when each of the first bonding metal 190 and the second bonding metal 290 is formed of copper (Cu), the bonding method may be a Cu—Cu bonding method, but this is only exemplary. Each of the first bonding metal 190 and the second bonding metal 290 may be formed of various metals such as aluminum (Al) or tungsten (W).

As the first bonding metal 190 and the second bonding metal 290 are bonded, the cell wiring structure 180 may be connected to the peripheral circuit wiring structure 260. Therefore, the bit line BL, the respective gate electrodes GSL, GSL2, WL11 to WL1*n*, WL21 to WL2*n*, SSL1 and SSL2, and/or the cell substrate 100 may be electrically connected to the peripheral circuit element PT.

The input/output pad 380 may be disposed on the second surface 100*b* of the cell substrate 100. For example, a second interlayer insulating layer 340 covering the cell substrate 100 and the insulating substrate 101 may be formed on the second surface 100*b* of the cell substrate 100. The input/output pad 380 may be formed on the second interlayer insulating layer 340. The second interlayer insulating layer 340 may include, for example, at least one of silicon oxide, silicon oxynitride or a low-k material having a dielectric constant lower than that of silicon oxide, but is not limited thereto.

The input/output pad 380 may be electrically connected to the cell structure and/or the peripheral circuit structure PERI. For example, a first contact plug 360 connecting the cell wiring structure 180 with the input/output pad 380 may be formed. For example, the first contact plug 360 may extend in the third direction Z to pass through the second interlayer insulating layer 340, the insulating substrate 101 and the first interlayer insulating layer 140. The input/output pad 380 may be electrically connected to the cell wiring structure 180 through the first contact plug 360.

In some embodiments, a width of the first contact plug 360 may be reduced as the first contact plug 360 extends toward the cell wiring structure 180. This may be due to characteristics of an etching process for forming the first contact plug 360.

In some embodiments, a first insulating spacer 361 extending along sides of the first contact plug 360 may be formed. For example, the first insulating spacer 361 may surround the sides of the first contact plug 360. The first insulating spacer 361 may include, for example, at least one of silicon oxide, silicon nitride or silicon oxynitride, but is not limited thereto.

At least a portion of the input/output pad 380 may overlap the cell array area CA. In more detail, at least a portion of the input/output pad 380 may overlap the mold opening MSo (or filling material layer 105) in the third direction Z. In some embodiments, at least a portion of the input/output pad 380 may overlap both the mold opening MSo (or filling material layer 105) and the substrate opening 1000 (or insulating substrate 101) in the third direction Z.

In some embodiments, the input/output pad 380 may be disposed over the cell array area CA and the outer area PA. For example, a portion of the input/output pad 380 may overlap the mold opening MSo (or filling material layer 105), and another portion of the input/output pad 380 may overlap the outer area PA.

In some embodiments, a capping insulating layer 342 may be formed on the input/output pad 380. The capping insulating layer 342 may include a pad opening 3420 that exposes at least a portion of the input/output pad 380. The input/output pad 380 may be electrically connected to an external device or the like through the pad opening 3420.

In order to improve the degree of integration of the semiconductor memory device, a pad on cell structure is suggested in which at least a portion of the input/output pad 380 overlaps the cell array area CA. However, the pad on cell structure has a problem in that a structure (e.g., mold structures MS1 and MS2) of the cell array area CA adjacent to the input/output pad 380 is damaged or destroyed due to a pressure applied to the input/output pad 380 during a bonding process (e.g., wire bonding process). In addition, as the input/output pad 380 overlaps the cell array area CA, a parasitic capacitance generated between the input/output pad 380 and an electrical structure (e.g., the cell substrate 100 and/or the gate electrodes GSL, WL11 to WL1*n*, WL21 to WL2*n* and SSL) of the cell array area CA, which is adjacent to the input/output pad 380, may deteriorate performance of the semiconductor memory device.

In contrast, the semiconductor memory device according to some embodiments provides an effective pad on cell structure by providing the mold opening MSo. Therefore, a semiconductor memory device having improved degree of integration may be provided.

In detail, as described above, the first mold stack MS1 may include a mold opening MSo formed to be adjacent to the outer area PA, and at least a portion of the input/output pad 380 may be disposed to overlap the mold opening MSo. Therefore, even when the input/output pad 380 overlaps the cell array area CA, the structure (i.e., the first mold stack MS1, etc.) of the cell array area CA adjacent to the input/output pad 380 may be effectively protected.

Also, in some embodiments, the cell substrate 100 may include a substrate opening 1000 that exposes at least a portion of the mold opening MSo, and at least a portion of the input/output pad 380 may be disposed to overlap both the mold opening MSo and the substrate opening 1000. Therefore, even when the input/output pad 380 overlaps the cell array area CA, parasitic capacitance between the input/output pad 380 and the electrical structure (i.e., the cell substrate 100, etc.) of the cell array area CA adjacent to the input/output pad 380 may be reduced or avoided.

In some embodiments, a region of the mold structure MS1 and MS2 adjacent to the mold opening MSo may not be provided to the memory cells of the memory cell array (e.g., 20 in FIG. 1). For example, as shown in FIG. 7, the mold structures MS1 and MS2 may include a first region I and a second region II, which are adjacent to the mold opening MSo. The first region I may be a region of the second mold stack MS2 that overlaps the mold opening MSo in the third direction Z. The second region II may be a region of the mold structures MS1 and MS2 that overlap the mold opening MSo and/or the first region I in the first direction X. At this time, at least a portion of the first region I and the second region II may not be provided to memory cells of the cell array area CA.

For example, at least a portion of the first region I and the second region II may be used as a system file and/or maintenance use of the semiconductor memory device. For example, at least a portion of the second gate electrodes WL21 to WL2*n* and SSL of the first region I may be provided to a word line capacitor. For example, at least a portion of the second region II may be provided to memory cells other than a memory cell array (e.g., 20 in FIG. 1). The first region I and the second region II may more improve the degree of integration of the semiconductor memory device by providing a space for a system file and/or maintenance use.

Figure 8:
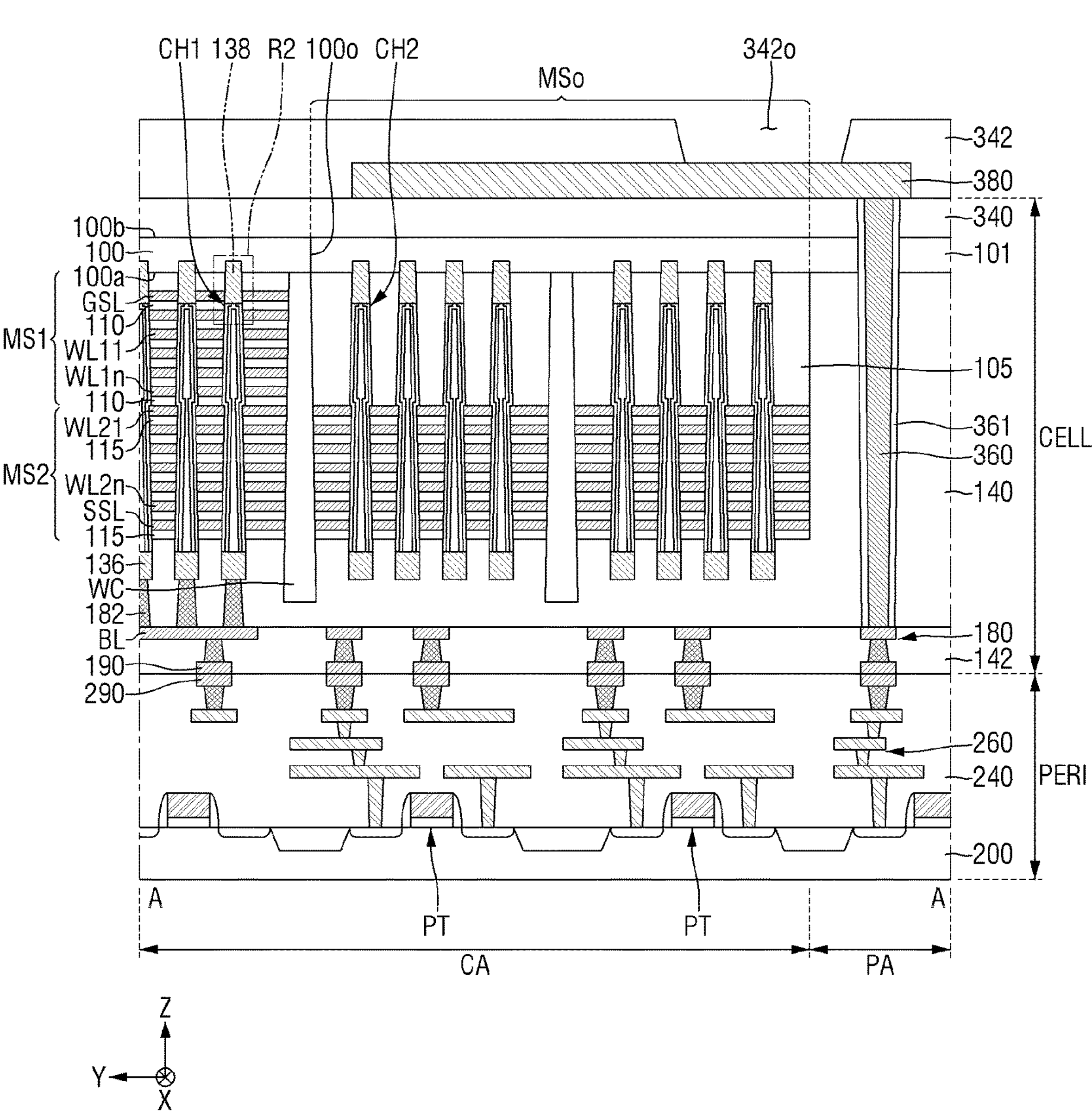
FIG. 8 is another cross-sectional view illustrating a semiconductor memory device according to some embodiments.
Figure 9:
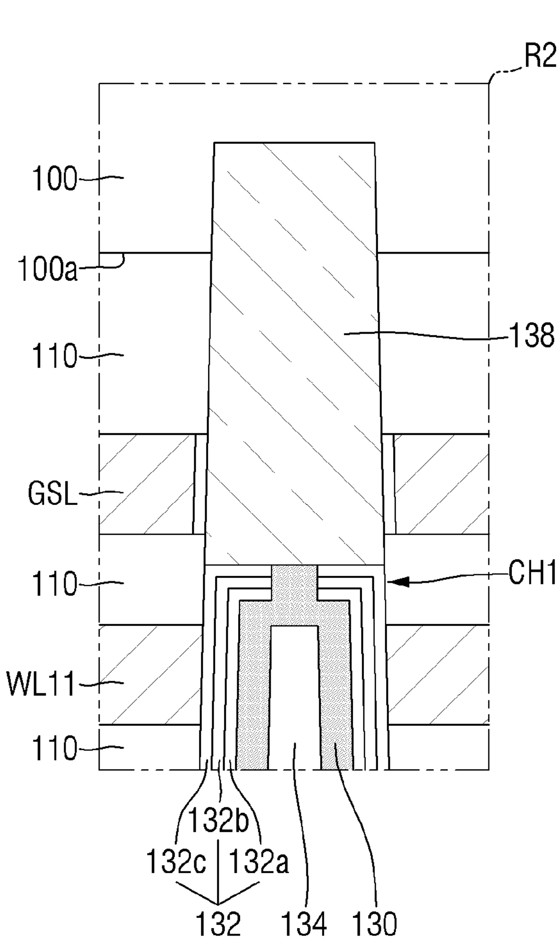
FIG. 9 is an enlarged view illustrating a region R2 of FIG. 8.

FIG. 8 is another cross-sectional view illustrating a semiconductor memory device according to some embodiments. FIG. 9 is an enlarged view illustrating a region R2 of FIG. 8. For convenience of description, redundant portions of those described with reference to FIGS. 1 to 7 will be briefly described or omitted.

Referring to FIGS. 8 and 9, in the semiconductor memory device according to some embodiments, the first channel structure CH1 further includes a source pattern 138.

The source pattern 138 may be formed on the cell substrate 100. The source pattern 138 may be connected to the semiconductor pattern 130. For example, the semiconductor pattern 130 may be in contact with the source pattern 138 by passing through the information storage layer 132. The source pattern 138 may include a conductive material, for example, polysilicon doped with impurities or metal, but is not limited thereto. The source pattern 138 and the cell substrate 100 may be provided as a common source line (e.g., CSL in FIG. 2) of the semiconductor memory device.

In some embodiments, the source pattern 138 may be an epitaxial pattern formed from the cell substrate 100 by a selective epitaxial growth process.

In some embodiments, the second channel structure CH2 may be formed at the same level as that of the first channel structure CH1. For example, the second channel structure CH2 may also include a source pattern 138.

Figure 10:
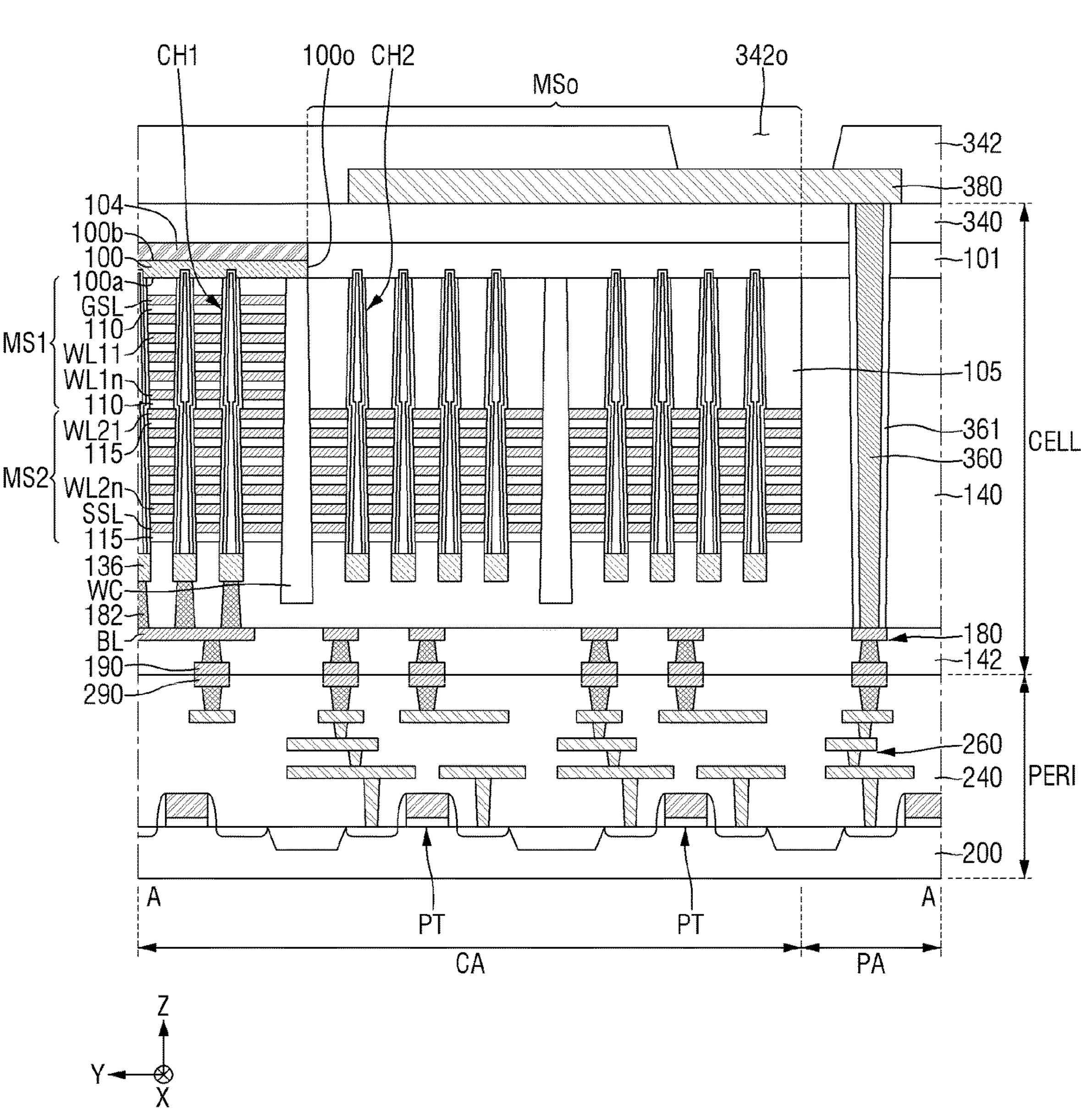
FIG. 10 is another cross-sectional view illustrating a semiconductor memory device according to some embodiments.

FIG. 10 is another cross-sectional view illustrating a semiconductor memory device according to some embodiments. For convenience of description, redundant portions of those described with reference to FIGS. 1 to 7 will be briefly described or omitted.

Referring to FIG. 10, the semiconductor memory device according to some embodiments further includes a conductive plate 104.

The conductive plate 104 may extend along the second surface 100*b* of the cell substrate 100. The conductive plate 104 may be electrically connected to the cell substrate 100. For example, a lower surface of the conductive plate 104 may be in contact with the second surface 100*b* of the cell substrate 100. The conductive plate 104 may include a conductive material, for example, a metal, such as tungsten (W), cobalt (Co) and nickel (Ni), or a metal silicide, but is not limited thereto. The conductive plate 104 may be used to reduce electrical resistance of a common source line (e.g., CSL in FIG. 2) that includes the cell substrate 100.

An upper surface of the conductive plate 104 is illustrated as being coplanar with a surface of the insulating substrate 101, but this is only exemplary. As another example, the upper surface of the conductive plate 104 may be higher than that of the insulating substrate 101.

Figure 11:
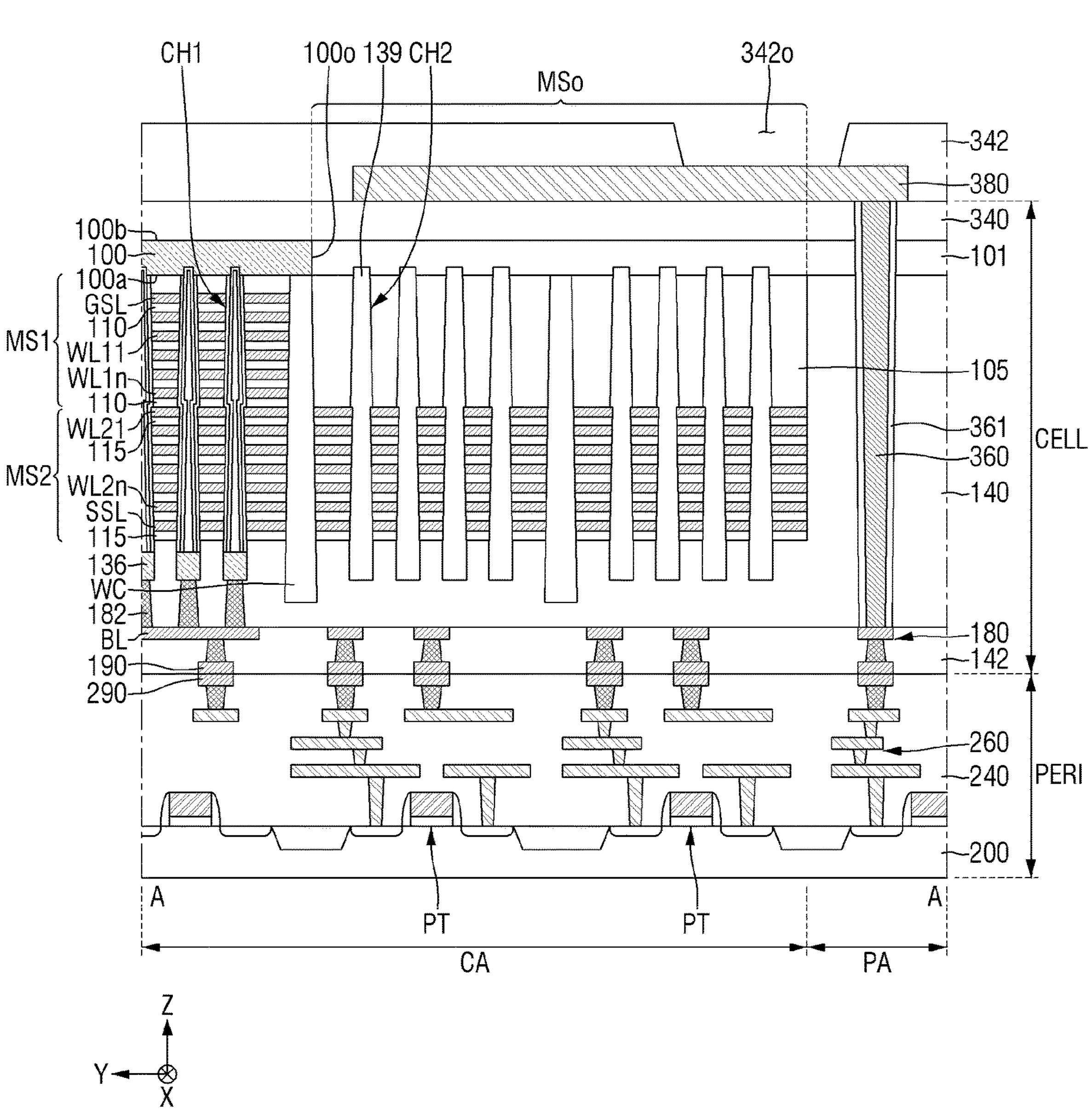
FIG. 11 is another cross-sectional view illustrating a semiconductor memory device according to some embodiments.

FIG. 11 is another cross-sectional view illustrating a semiconductor memory device according to some embodiments. For convenience of description, redundant portions of those described with reference to FIGS. 1 to 7 will be briefly described or omitted.

Referring to FIG. 11, in the semiconductor memory device according to some embodiments, the second channel structure CH2 is formed at a level different from that of the first channel structure CH1.

For example, the second channel structure CH2 may include a material different from that of the first channel structure CH1. In some embodiments, the second channel structure CH2 may include an insulating pattern 139. The insulating pattern 139 may include, for example, at least one of silicon oxide, silicon nitride or silicon oxynitride, but is not limited thereto. For example, the insulating pattern 139 may include silicon oxide.

Figure 12:
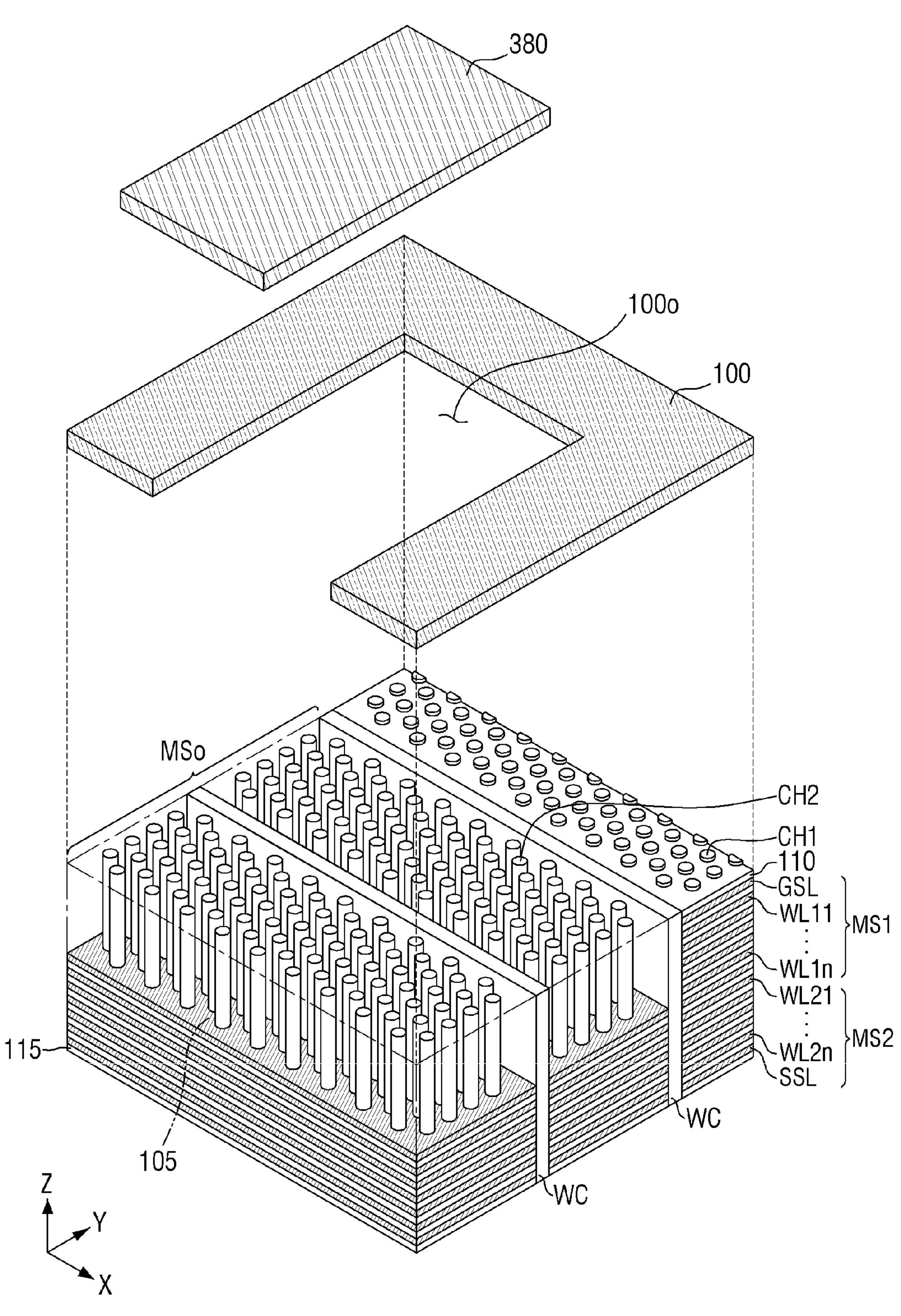
FIG. 12 is another partially exploded perspective view illustrating a semiconductor memory device according to some embodiments.

FIG. 12 is another partially exploded perspective view illustrating a semiconductor memory device according to some embodiments. For convenience of description, redundant portions of those described with reference to FIGS. 1 to 7 will be briefly described or omitted.

Referring to FIG. 12, in the semiconductor memory device according to some embodiments, the mold opening MSo (or filling material layer 105) extends to be long (e.g. longitudinally) along the edge of the cell array area (CA in FIG. 4).

For example, the mold opening MSo may extend to be long in the first direction X. The mold opening MSo may entirely expose an upper surface of the second mold stack MS2 adjacent to the outer area (PA in FIG. 4), or may expose a greater portion of the upper surface of the second mold stack MS2 in comparison to other embodiments described herein. The term "expose" may be used herein to describe localized relationships between elements or components, and may not preclude the presence of other elements on or covering the particular elements or components in a completed device.

In some embodiments, the substrate opening 1000 may expose a portion of the mold opening MSo (or filling material layer 105). For example, a portion of the mold opening MSo may be covered by the cell substrate 100, and another portion of the mold opening MSo may be exposed by the substrate opening 1000. As an example, the mold opening MSo may be larger than the substrate opening 1000 in at least one direction. At least a portion of the input/output pad 380 may overlap both the mold opening MSo (or filling material layer 105) and the substrate opening 1000 (or insulating substrate 101) in the third direction Z.

Figure 13:
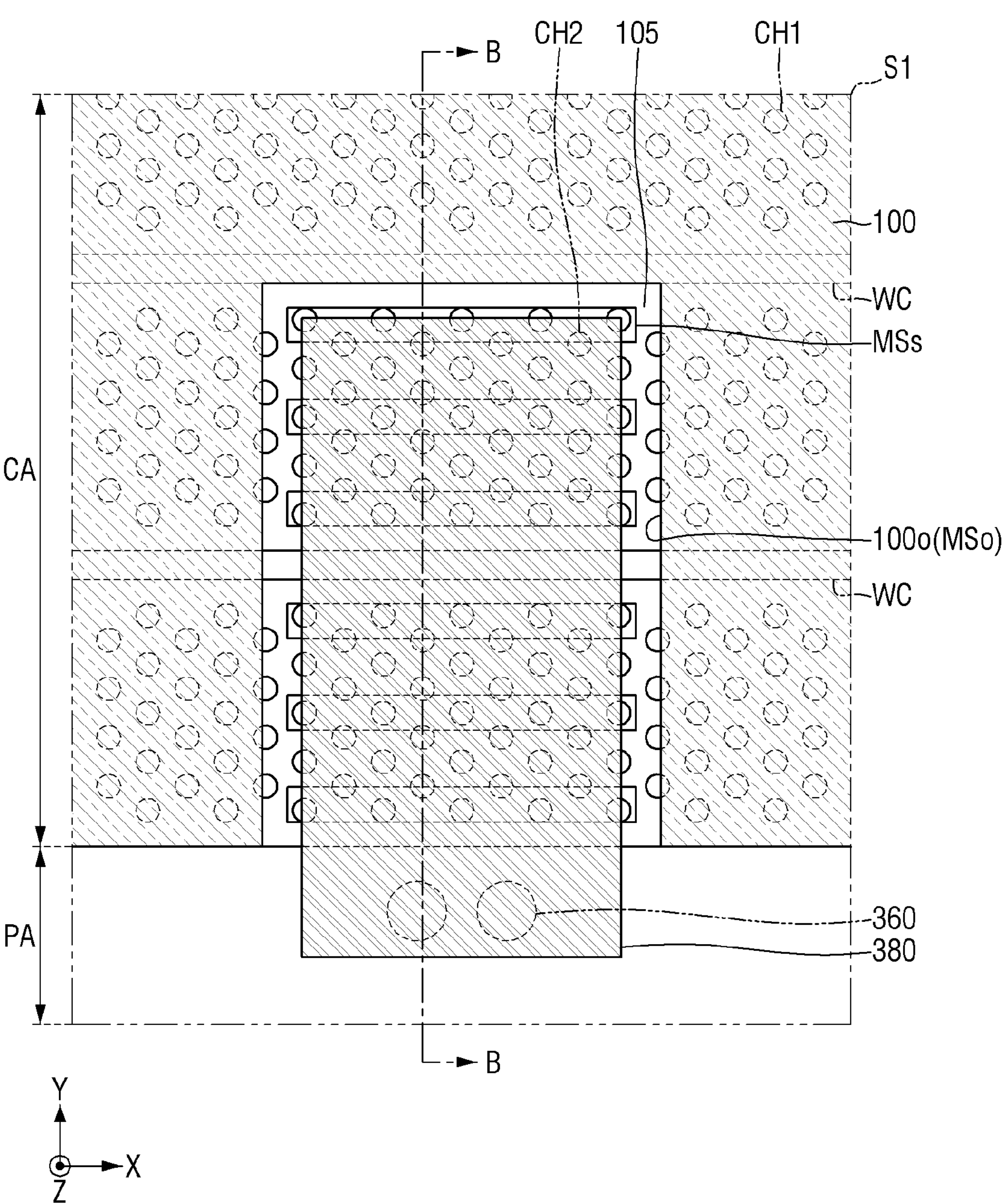
FIG. 13 is another exemplary layout view illustrating the region of FIG. 3.
Figure 14:
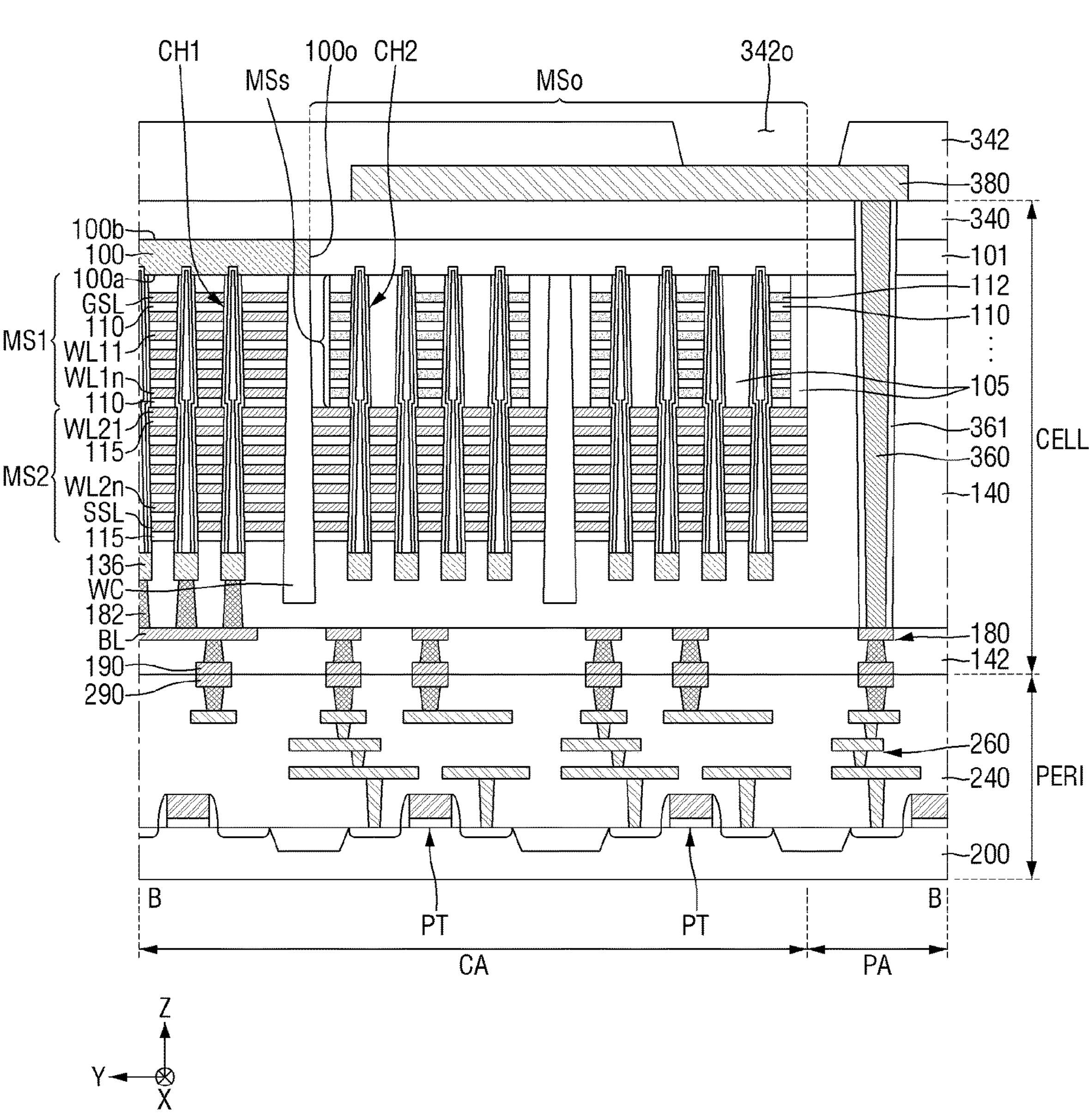
FIG. 14 is a cross-sectional view taken along line B-B of FIG. 13.
Figure 15:
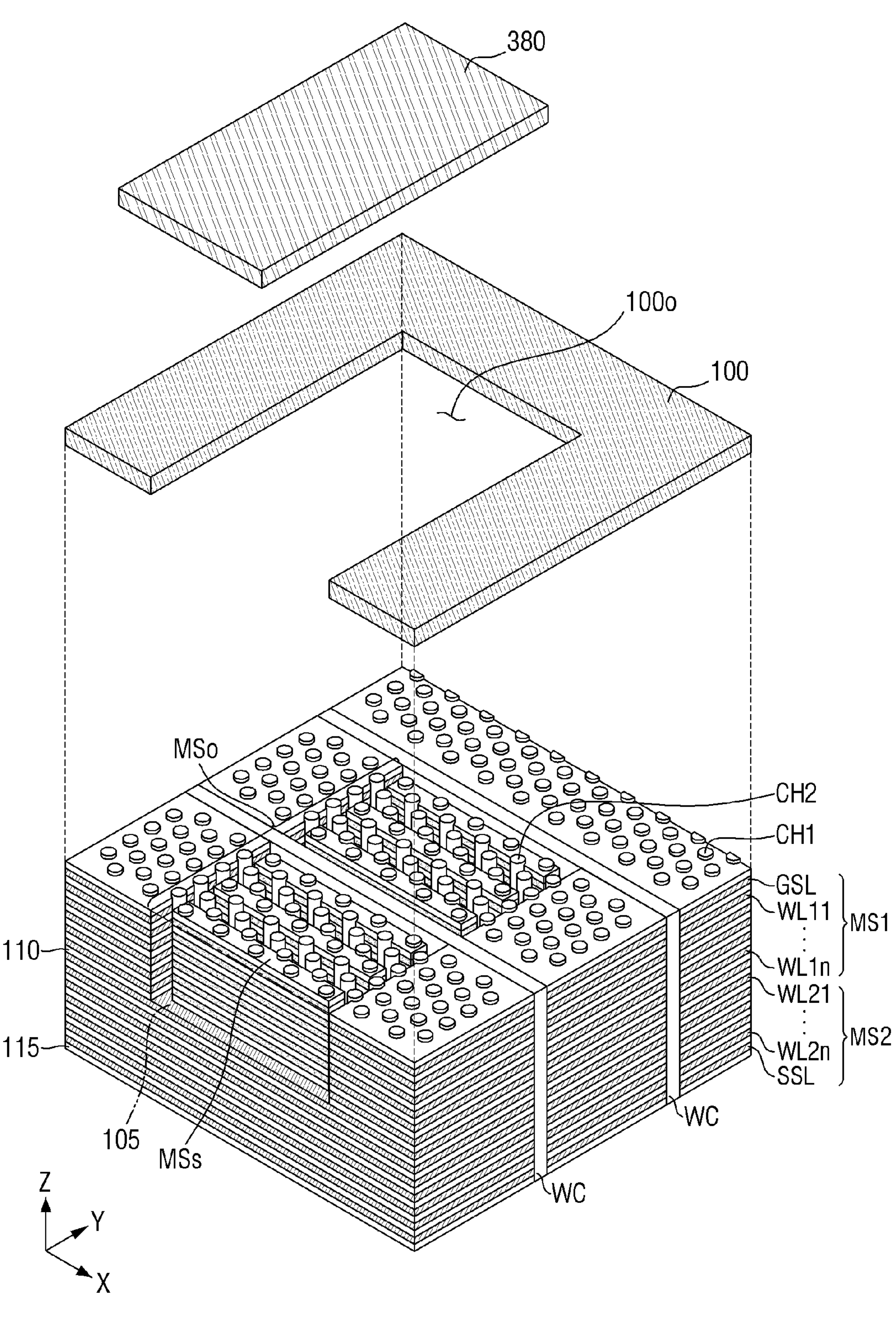
FIG. 15 is a partially exploded perspective view illustrating the semiconductor memory device according to FIGS. 13 and 14.

FIG. 13 is another exemplary layout view illustrating the region of FIG. 3. FIG. 14 is a cross-sectional view taken along line B-B of FIG. 13. FIG. 15 is a partially exploded perspective view illustrating the semiconductor memory device according to FIGS. 13 and 14. For convenience of description, redundant portions of those described with reference to FIGS. 1 to 7 will be briefly described or omitted.

Referring to FIGS. 13 to 15, the semiconductor memory device according to some embodiments further includes a support stack MSs.

The support stack MSs may be disposed in the mold opening MSo (or filling material layer 105). For example, the support stack MSs may be interposed between the insulating substrate 101 and the second mold stack MS2. Although only six support stacks MSs extending in parallel in the first direction X in the mold opening MSo are illustrated, this is only exemplary. Various modifications may be made in the number and arrangement of the support stacks MSs.

In some embodiments, the second channel structure CH2 may extend in the third direction Z to pass through the support stack MSs.

In some embodiments, the support stack MSs may be spaced apart from the first gate electrodes GSL and WL11 to WL In of the first mold stack MS1, e.g., in a lateral (X- or Y-) direction that is perpendicular to the vertical (Z-) direction). Further, in some embodiments, the support stack MSs may be spaced apart from the word line cutting region WC in a lateral direction.

In some embodiments, the support stack MSs may include first mold insulating layers 110 and first mold sacrificial layers 112, which are alternately stacked. The first mold sacrificial layers 112 of the support stack MSs may be disposed at the same level as that of the first gate electrodes GSL, WL11 to WL In of the first mold stack MS1. In the present disclosure, the expression "disposed at the same level" refers to being disposed at the same height based on or relative to the cell substrate 100. For example, the plurality of first mold sacrificial layers 112 may correspond to the plurality of first gate electrodes GSL and WL11 to WL1*n* one-to-one.

The first mold sacrificial layer 112 may include a material having an etch selectivity with respect to the first mold insulating layer 110. For example, the first mold insulating layer 110 may include a silicon oxide layer, and the first mold sacrificial layer 112 may include a silicon nitride layer.

Figure 16:
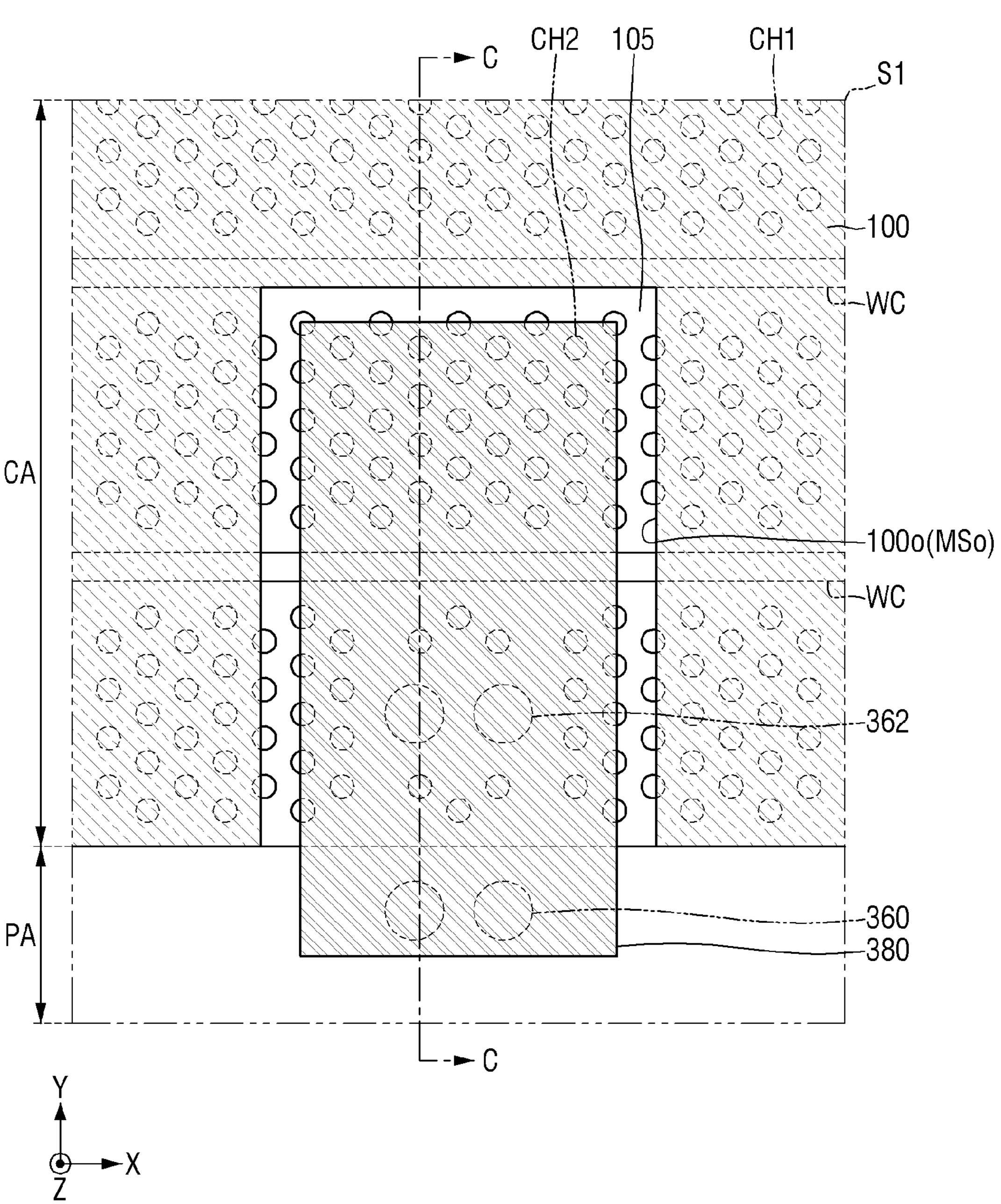
FIG. 16 is another exemplary layout view illustrating the region S1 of FIG. 3.
Figure 17:
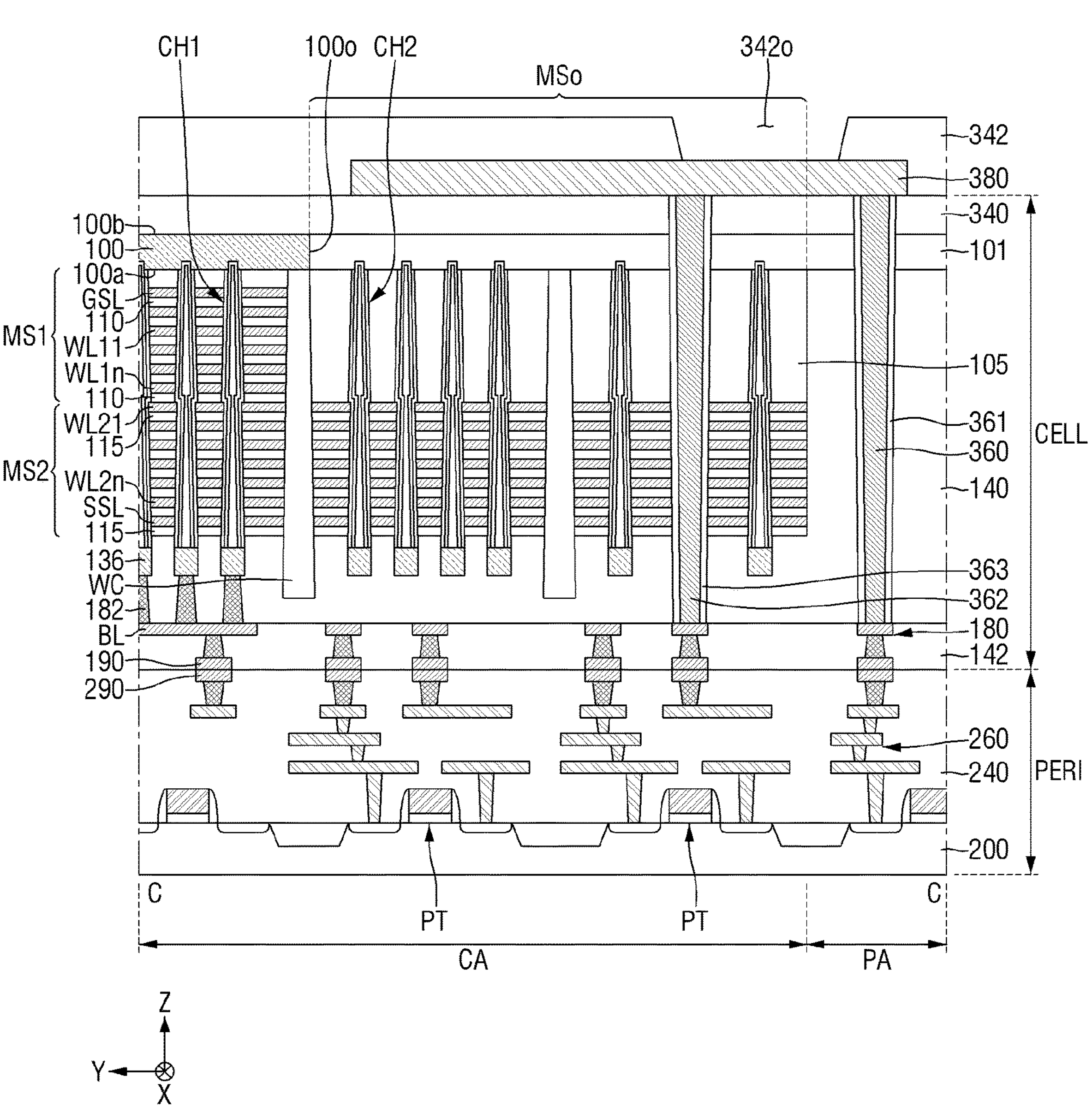
FIG. 17 is a cross-sectional view taken along line C-C of FIG. 16.

FIG. 16 is another exemplary layout view illustrating the region S1 of FIG. 3. FIG. 17 is a cross-sectional view taken along line C-C of FIG. 16. For convenience of description, redundant portions of those described with reference to FIGS. 1 to 7 will be briefly described or omitted.

Referring to FIGS. 16 and 17, the semiconductor memory device according to some embodiments includes a second contact plug 362.

The second contact plug 362 may connect the cell wiring structure 180 with the input/output pad 380 through the mold opening MSo (or filling material layer 105). For example, the second contact plug 362 may extend in the third direction Z to pass through the second interlayer insulating layer 340, the insulating substrate 101, the filling material layer 105, the second mold stack MS2 and the first interlayer insulating layer 140. The input/output pad 380 may be electrically connected to the cell wiring structure 180 through the second contact plug 362. In some embodiments, the input/output pad 380 may be electrically connected to the cell wiring structure 180 through the first contact plug 360 and a second contact plug 362.

In some embodiments, a width of the second contact plug 362 may be reduced as the second contact plug 362 extends toward the cell wiring structure 180. This may be due to characteristics of an etching process for forming the second contact plug 362. In some embodiments, the second contact plug 362 may be formed at the same level as that of the first contact plug 360.

In some embodiments, a second insulating spacer 363 extending along sides of the second contact plug 362 may be formed. For example, the second insulating spacer 363 may surround the sides of the second contact plug 362. In some embodiments, the second insulating spacer 363 may be formed at the same level as that of the first insulating spacer 361.

Figure 18:
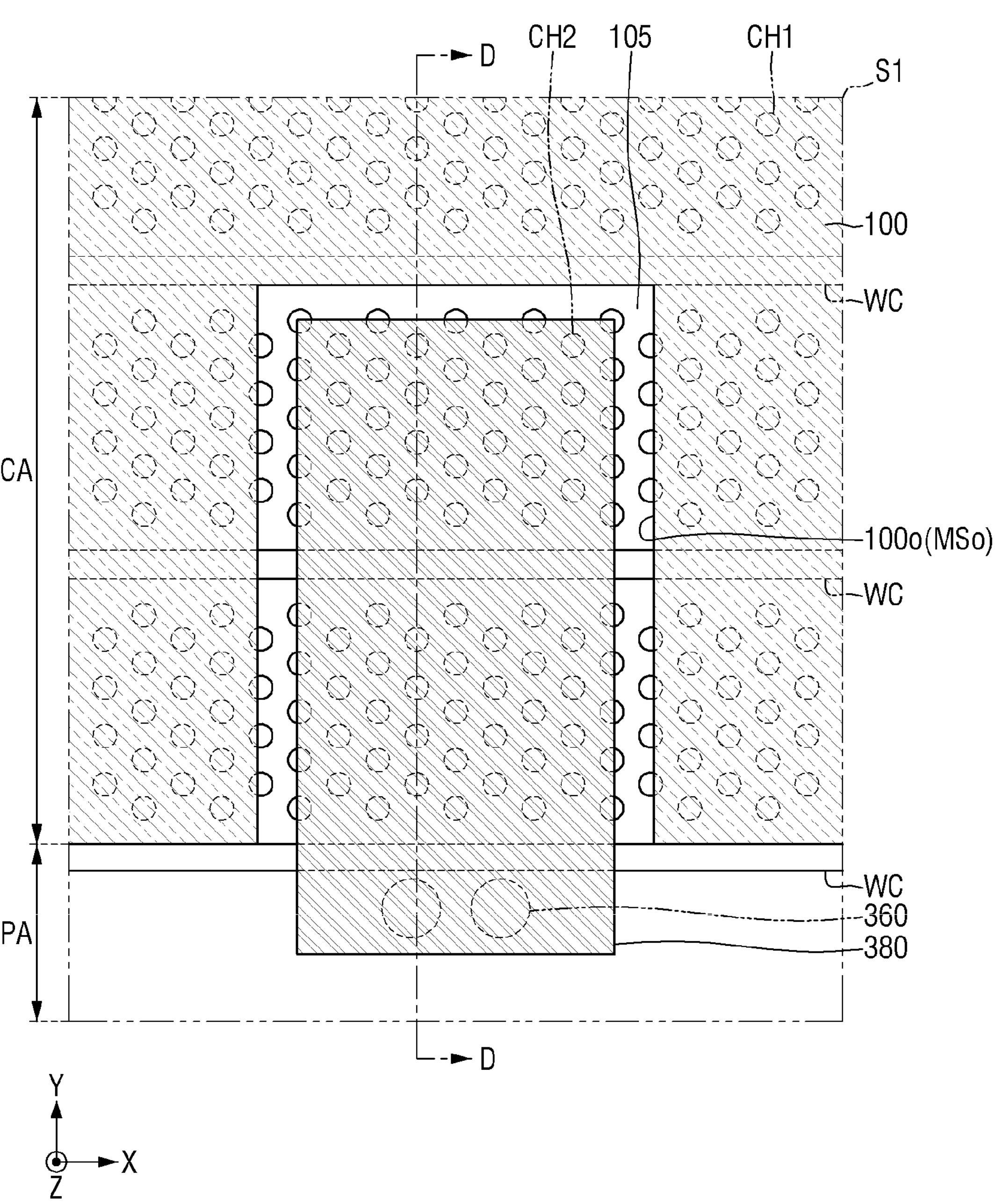
FIG. 18 is another exemplary layout view illustrating the region S1 of FIG. 3.
Figure 19:
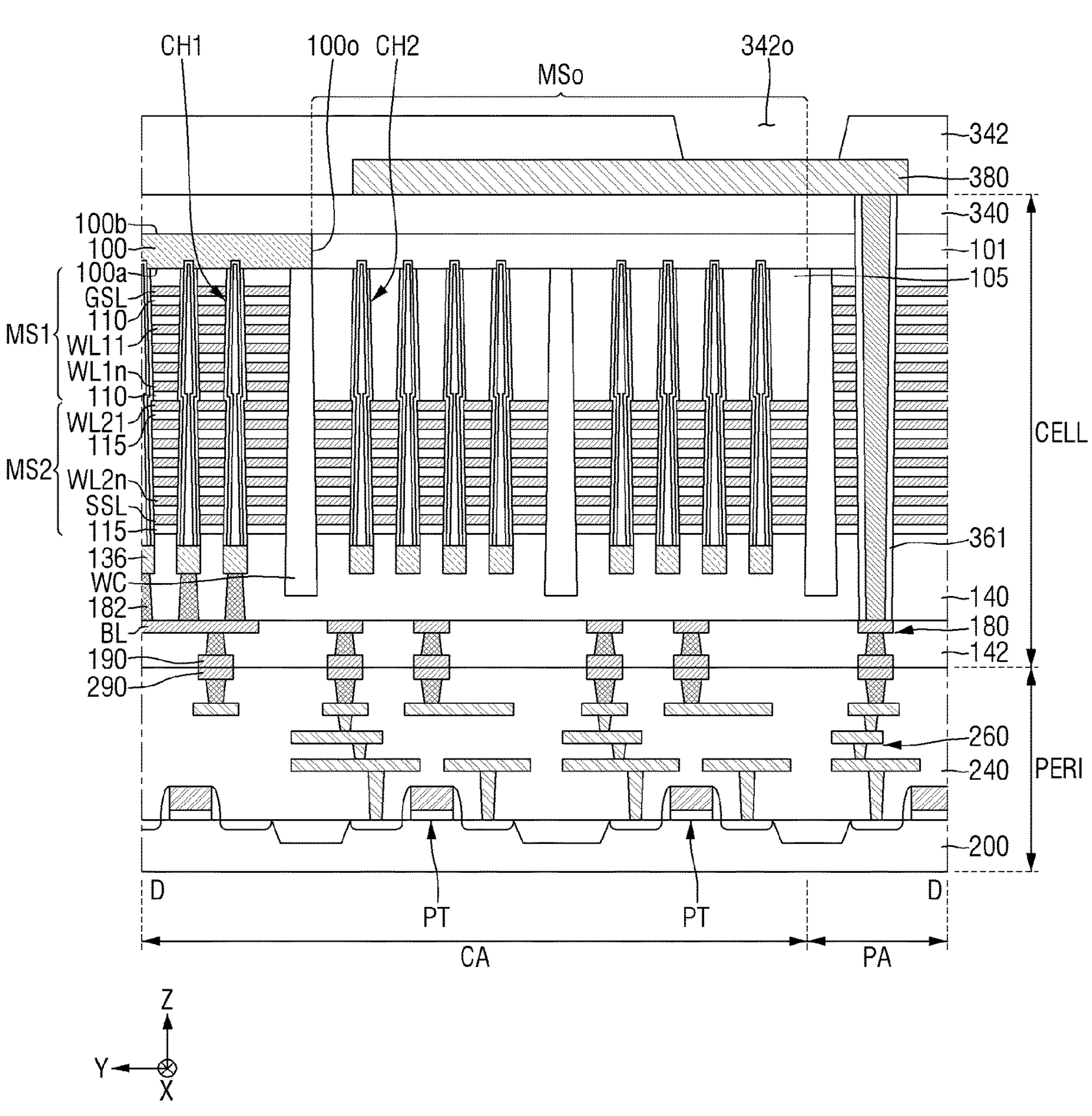
FIG. 19 is a cross-sectional view taken along line D-D of FIG. 18.

FIG. 18 is another exemplary layout view illustrating the region S1 of FIG. 3. FIG. 19 is a cross-sectional view taken along line D-D of FIG. 18. For convenience of description, redundant portions of those described with reference to FIGS. 1 to 7 will be briefly described or omitted.

Referring to FIGS. 18 and 19, in the semiconductor memory device according to some embodiments, the mold structures MS1 and MS2 are formed over the cell array area CA and the outer area PA.

For example, in a fabricating process of the semiconductor memory device according to some embodiments, the mold structure MS1 and MS2 disposed in the outer area PA may remain without being removed.

The first contact plug 360 disposed in the outer area PA may pass through the mold structures MS1 and MS2 disposed in the outer area PA. For example, the first contact plug 360 may extend in the third direction Z to pass through the second interlayer insulating layer 340, the insulating substrate 101, the mold structures MS1 and MS2 and the first interlayer insulating layer 140. The input/output pad 380 may be electrically connected to the cell wiring structure 180 through the first contact plug 360.

Figure 20:
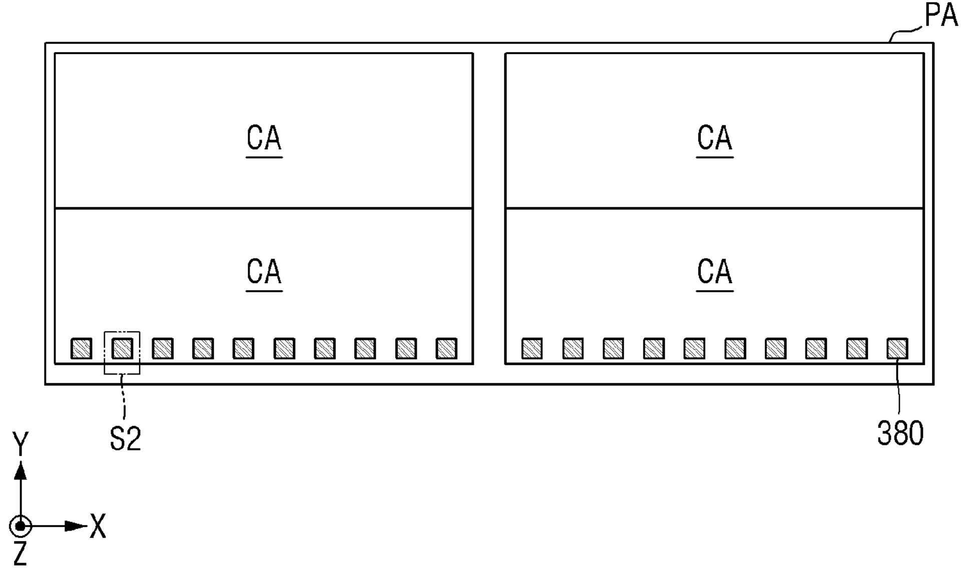
FIG. 20 is another schematic layout view illustrating a semiconductor memory device according to some embodiments.
Figure 21:
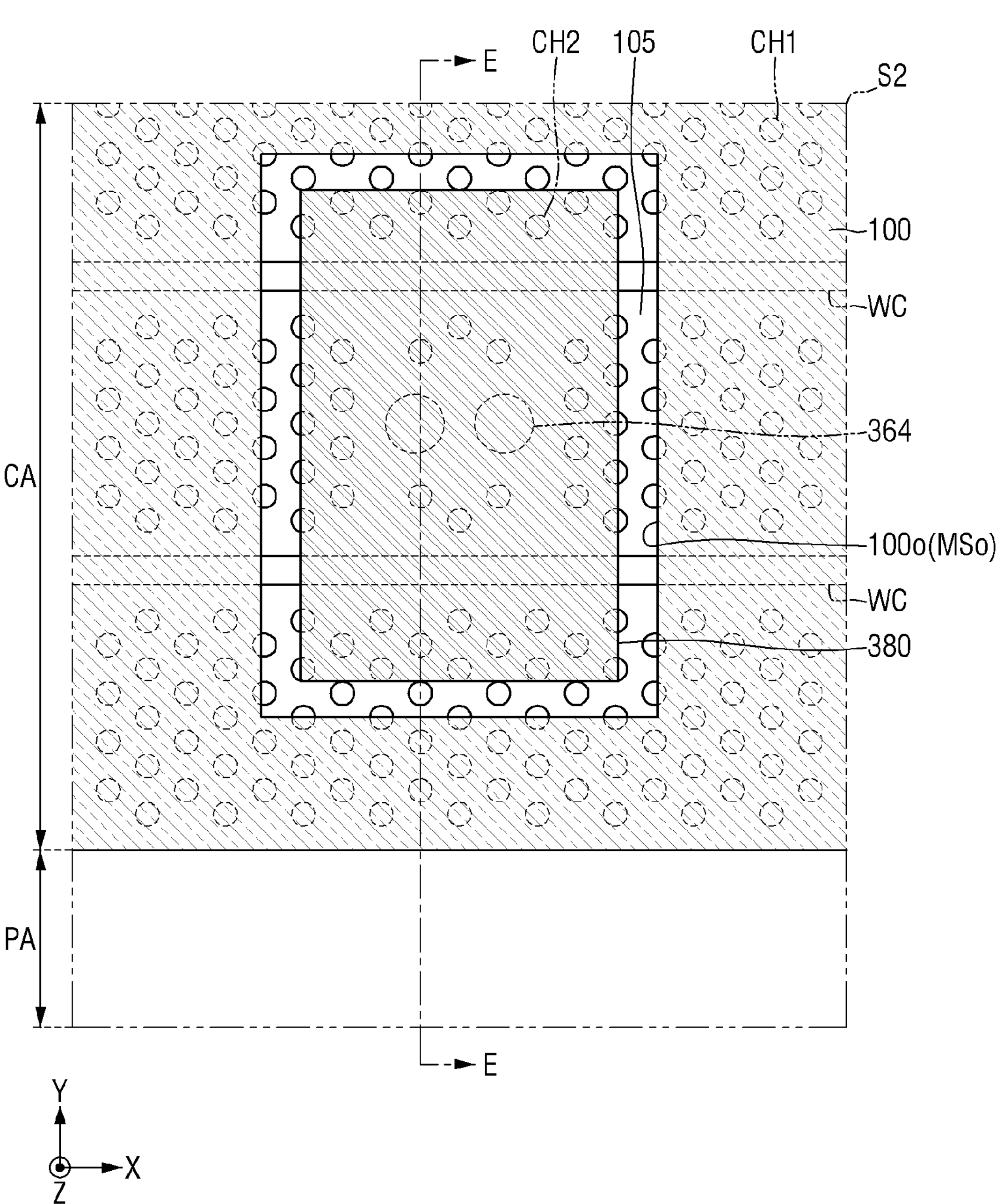
FIG. 21 is an exemplary layout view illustrating the region S2 of FIG. 20.
Figure 22:
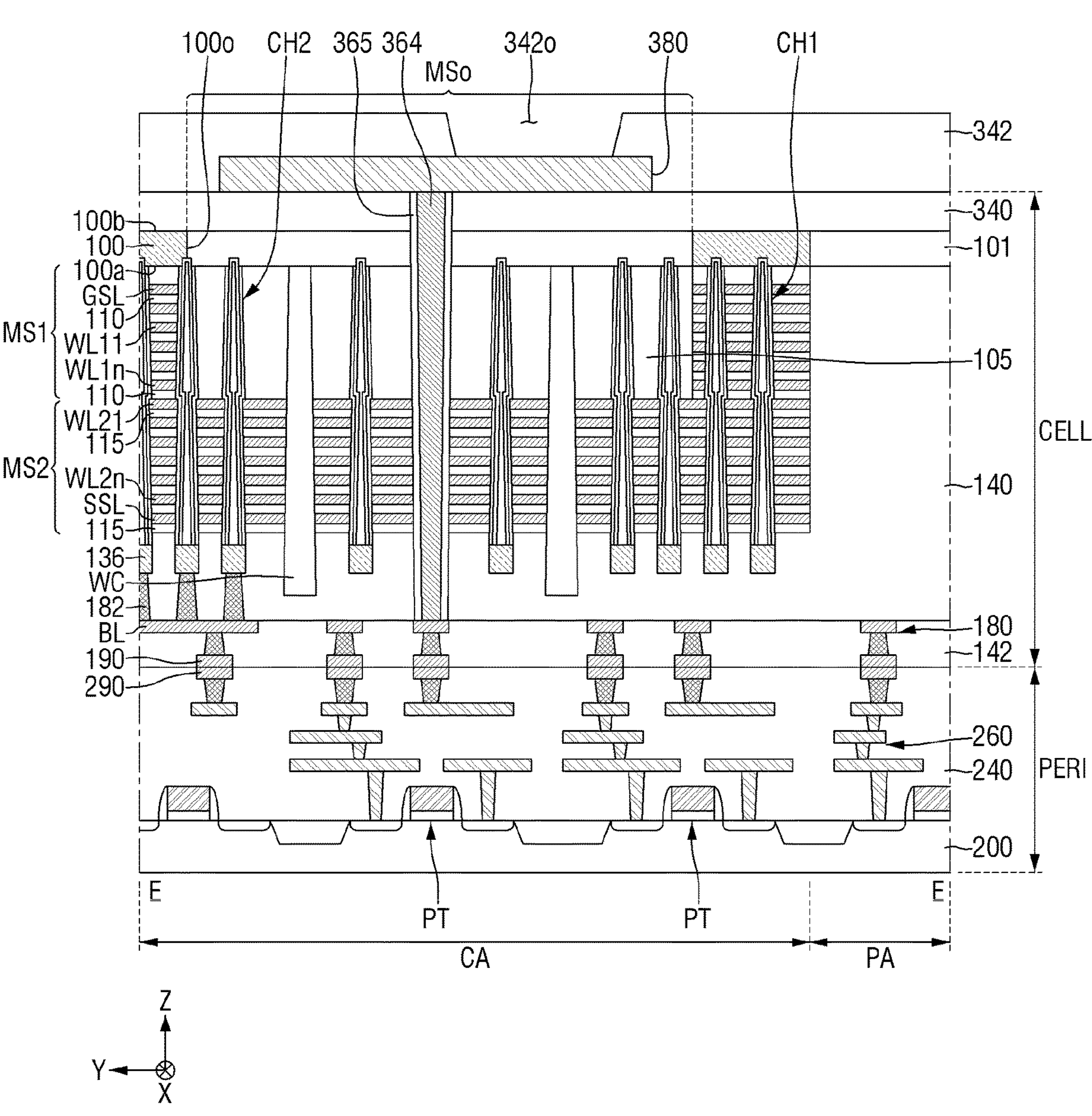
FIG. 22 is a cross-sectional view taken along line E-E of FIG. 21.

FIG. 20 is another schematic layout view illustrating a semiconductor memory device according to some embodiments. FIG. 21 is an exemplary layout view illustrating the region S2 of FIG. 20. FIG. 22 is a cross-sectional view taken along line E-E of FIG. 21. For convenience of description, redundant portions of those described with reference to FIGS. 1 to 7 will be briefly described or omitted.

Referring to FIGS. 20 to 22, in the semiconductor memory device according to some embodiments, the input/output pad 380 completely overlaps the cell array area CA, rather than overlapping both the cell area CA and the peripheral area PA.

In more detail, the input/output pad 380 may entirely overlap the mold opening MSo (or filling material layer 105) in the third direction Z. In some embodiments, the input/output pad 380 may entirely overlap both the mold opening MSo (or filling material layer 105) and the substrate opening 1000 (or insulating substrate 101) in the third direction Z.

In some embodiments, the mold opening MSo may not be opened at (e.g., may not extend to) the edge of the first mold stack MS1. For example, all sides of the mold opening MSo may be defined by inner sides of the first mold stack MS1.

In some embodiments, a third contact plug 364 connecting the cell wiring structure 180 with the input/output pad 380 may be formed. The third contact plug 364 may connect the cell wiring structure 180 with the input/output pad 380 by passing through the mold opening MSo (or filling material layer 105). For example, the third contact plug 364 may extend in the third direction Z to pass through the second interlayer insulating layer 340, the insulating substrate 101, the filling material layer 105, the second mold stack MS2 and the first interlayer insulating layer 140. The input/output pad 380 may be electrically connected to the cell wiring structure 180 through the third contact plug 364.

In some embodiments, a width of the third contact plug 364 may be reduced as the third contact plug 364 extends toward the cell wiring structure 180. This may be due to characteristics of an etching process for forming the third contact plug 364.

In some embodiments, a third insulating spacer 365 extending along sides of the third contact plug 364 may be formed. For example, the third insulating spacer 365 may surround the sides of the third contact plug 364.

Hereinafter, a method for fabricating a semiconductor device according to exemplary embodiments will be described with reference to FIGS. 1 to 27.

FIGS. 23 to 30 are views illustrating intermediate steps to describe a method for fabricating a semiconductor memory device according to some embodiments. For convenience of description, redundant portions of those described with reference to FIGS. 1 to 22 will be briefly described or omitted.

Figure 23:
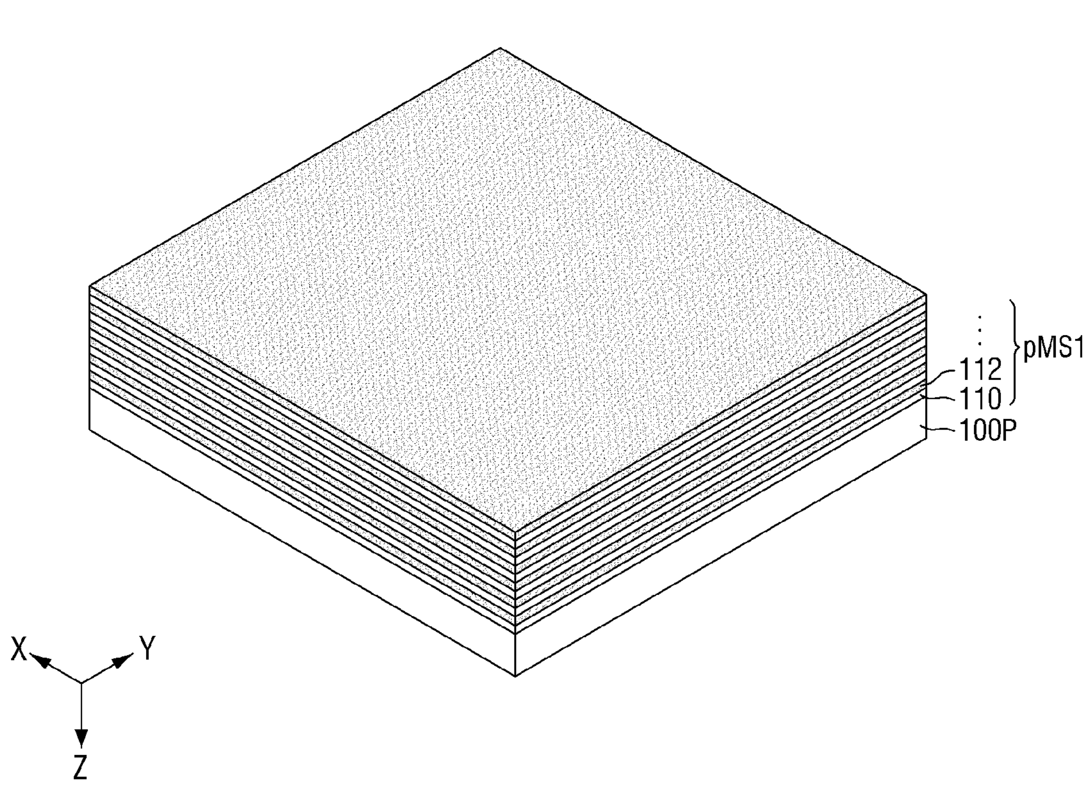

Referring to FIG. 23, a first pre-mold pMS1 is formed on a base substrate 100P.

The first pre-mold pMS1 may be formed on a front side of the base substrate 100P. The first pre-mold pMS1 may include a plurality of first mold insulating layers 110 and a plurality of first mold sacrificial layers 112, which are alternately stacked on the base substrate 100P. The first mold sacrificial layer 112 may include a material having an etch selectivity with respect to the first mold insulating layer 110. For example, the first mold insulating layer 110 may include a silicon oxide layer, and the first mold sacrificial layer 112 may include a silicon nitride layer.

Figure 24:
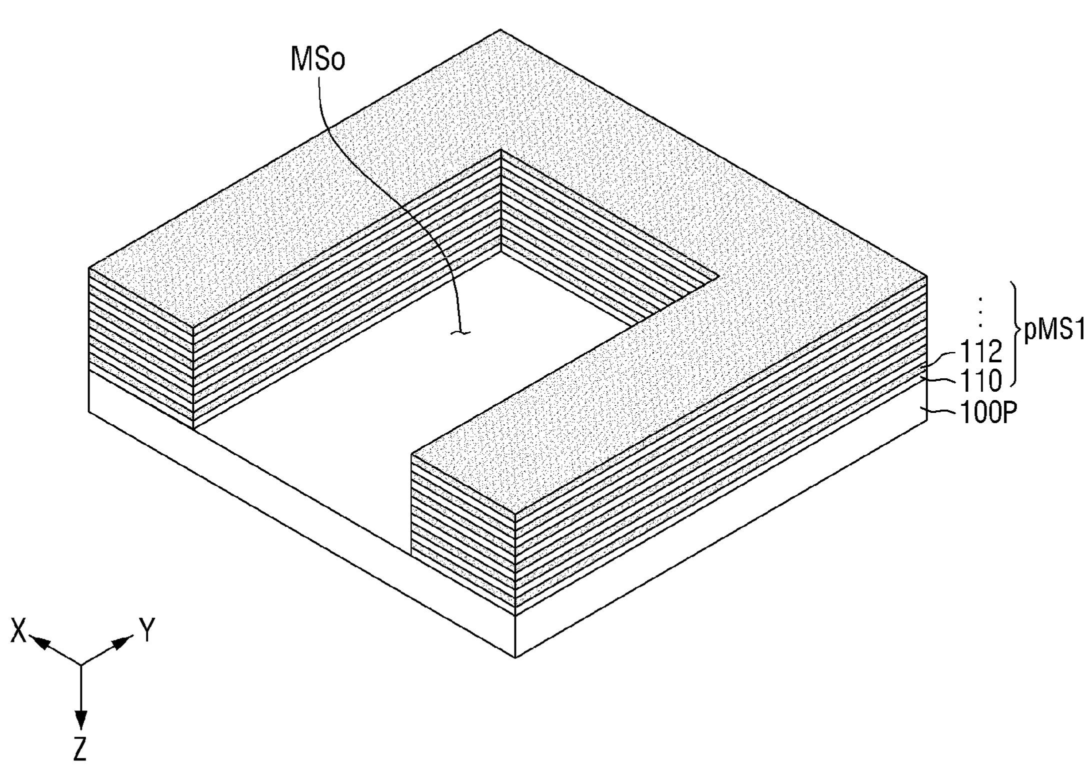

Referring to FIG. 24, a mold opening MSo is formed in the first pre-mold pMS1.

The mold opening MSo may expose a portion of the base substrate 100P in plan view. For example, the mold opening MSo may extend in the third direction Z to pass through the first pre-mold pMS1, and may not pass through the base substrate 100P. The mold opening may overlap a portion of the base substrate 100P in the third direction Z.

Figure 25:
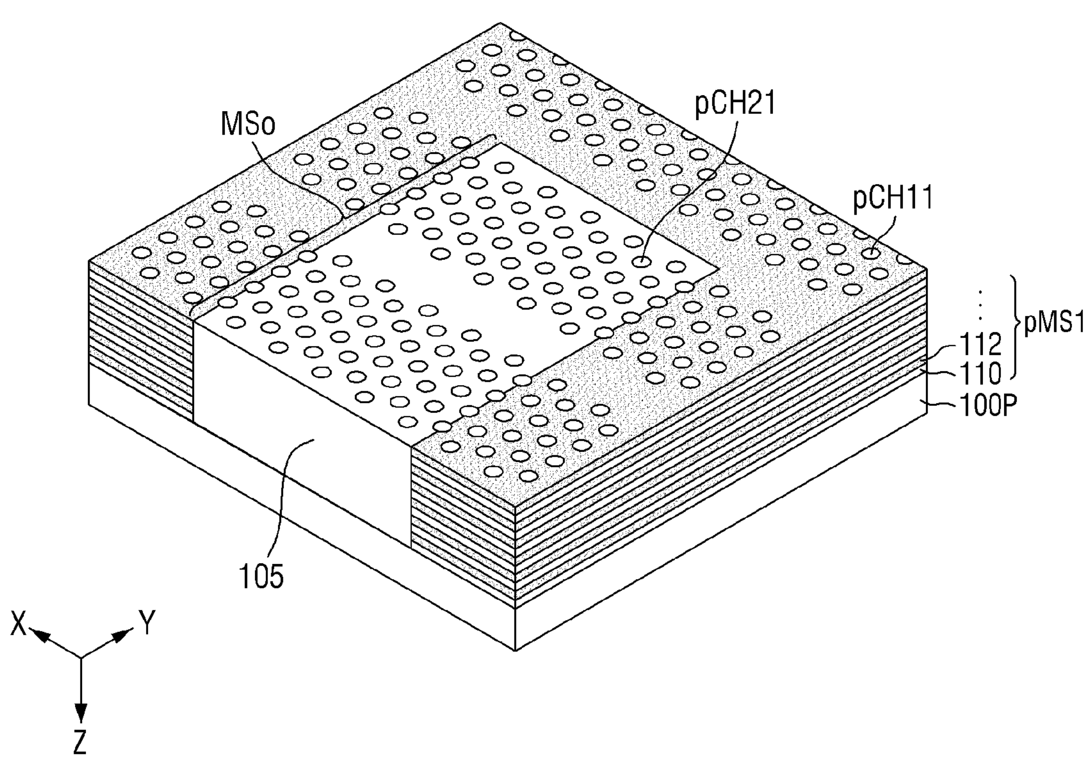

Referring to FIG. 25, a first lower pre-channel pCH11 and a second lower pre-channel pCH21 are formed.

The first lower pre-channel pCH11 may extend in the third direction Z and pass through the first pre-mold pMS1. In addition, the first lower pre-channel pCH11 may be connected to the base substrate 100P. The first lower pre-channel pCH11 may include a material having an etch selectivity with respect to the first mold insulating layer 110 and the first mold sacrificial layer 112. For example, the first lower pre-channel pCH11 may include polysilicon (poly-Si).

The second lower pre-channel pCH21 may extend in the third direction Z to pass through the mold opening MSo. For example, a filling material layer 105 filling the mold opening MSo may be formed on the base substrate 100P. The filling material layer 105 may include an insulating material, for example, at least one of silicon oxide, silicon nitride or silicon oxynitride, but is not limited thereto. The second lower pre-channel pCH21 may extend in the third direction Z to pass through the filling material layer 105. In some embodiments, a second channel structure CH2 may be formed at the same level as that of a first channel structure CH1. For example, the second lower pre-channel pCH21 may include polysilicon (poly-Si).

Figure 26:
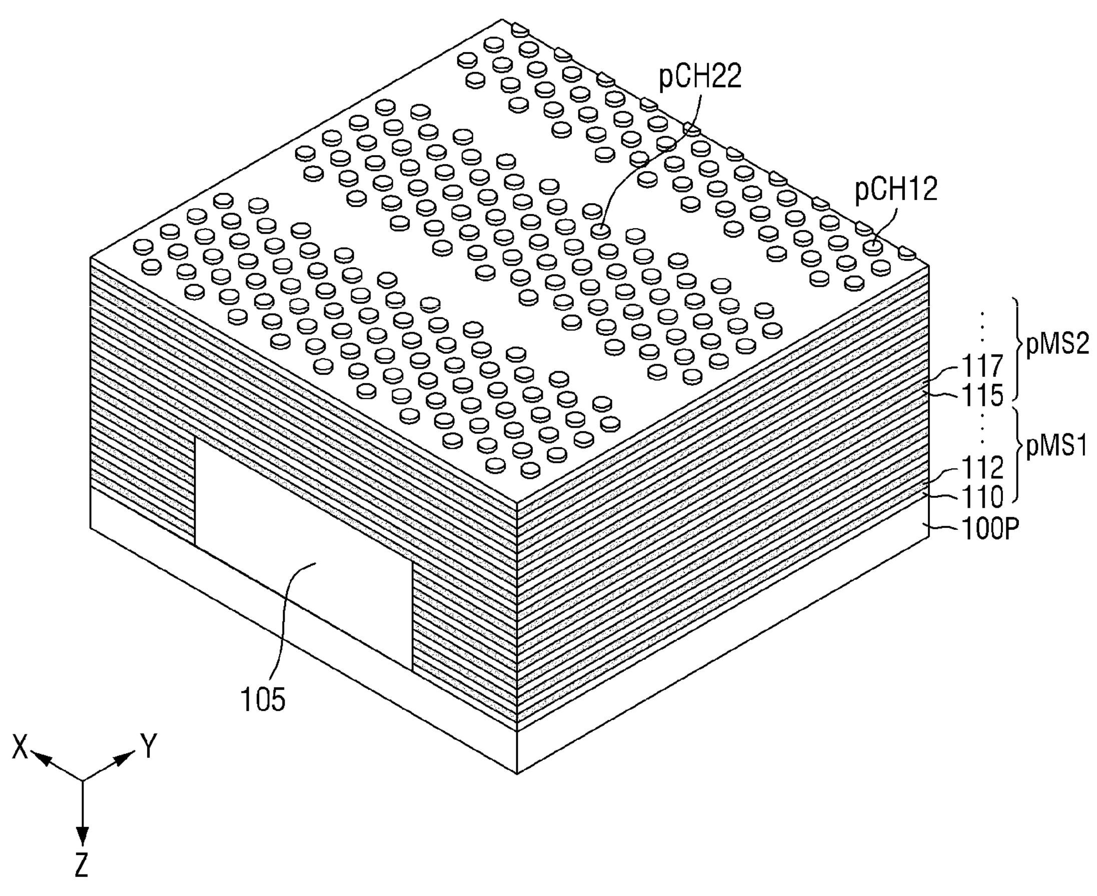

Referring to FIG. 26, a second pre-mold pMS2, a first upper pre-channel pCH12 and a second upper pre-channel pCH22 are formed on the first pre-mold pMS1.

The second pre-mold pMS2 may include a plurality of second mold insulating layers 115 and a plurality of second mold sacrificial layers 117, which are alternately stacked on the first pre-mold pMS1. Since the formation of the second pre-mold pMS2 may be similar to the formation of the first pre-mold pMS1, its detailed description will be omitted.

Each of the first upper pre-channel pCH12 and the second upper pre-channel pCH22 may pass through the second pre-mold pMS2. The first upper pre-channel pCH12 may be connected to the first lower pre-channel pCH11, and the second upper pre-channel pCH22 may be connected to the second lower pre-channel pCH21. Since the formation of the first upper pre-channel pCH12 and the second upper pre-channel pCH22 may be similar to the formation of the first lower pre-channel pCH11, its detailed description will be omitted.

Figure 27:
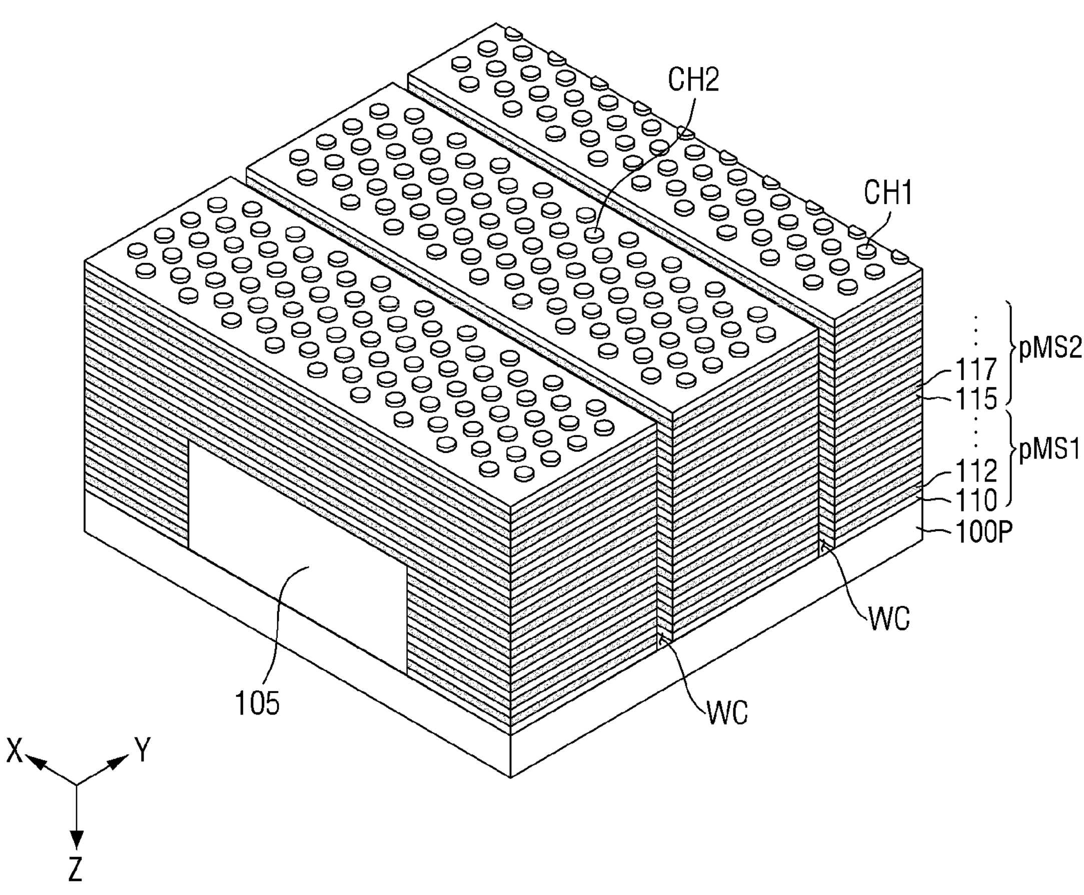

Referring to FIG. 27, the first channel structure CH1, the second channel structure CH2 and a word line cutting region WC are formed.

For example, the first lower pre-channel pCH11, the first upper pre-channel pCH12, the second lower pre-channel pCH21 and the second upper pre-channel pCH22 may be selectively removed. Subsequently, the first channel structure CH1 replacing the region, from which the first lower pre-channel pCH11 and the first upper pre-channel pCH12 are removed, may be formed. As a result, the first channel structure CH1 passing through the first pre-mold pMS1 and the second pre-mold pMS2 may be formed. In addition, the second channel structure CH2 replacing the region, from which the second lower pre-channel pCH21 and the second upper pre-channel pCH22 are removed, may be formed. As a result, the second channel structure CH2 passing through the mold opening MSo (or filling material layer 105) and the second pre-mold pMS2 may be formed.

In some embodiments, the second channel structure CH2 may be formed at the same level (i.e., using one or more same processes) as that of the first channel structure CH1. In some other embodiments, the second channel structure CH2 may be formed at a level different (i.e., using one or more different processes) from that of the first channel structure CH1.

Subsequently, the word line cutting region WC may be formed. The word line cutting region WC may extend in the first direction X to cut or separate portions of the first pre-mold pMS1 and the second pre-mold pMS2.

Figure 28:
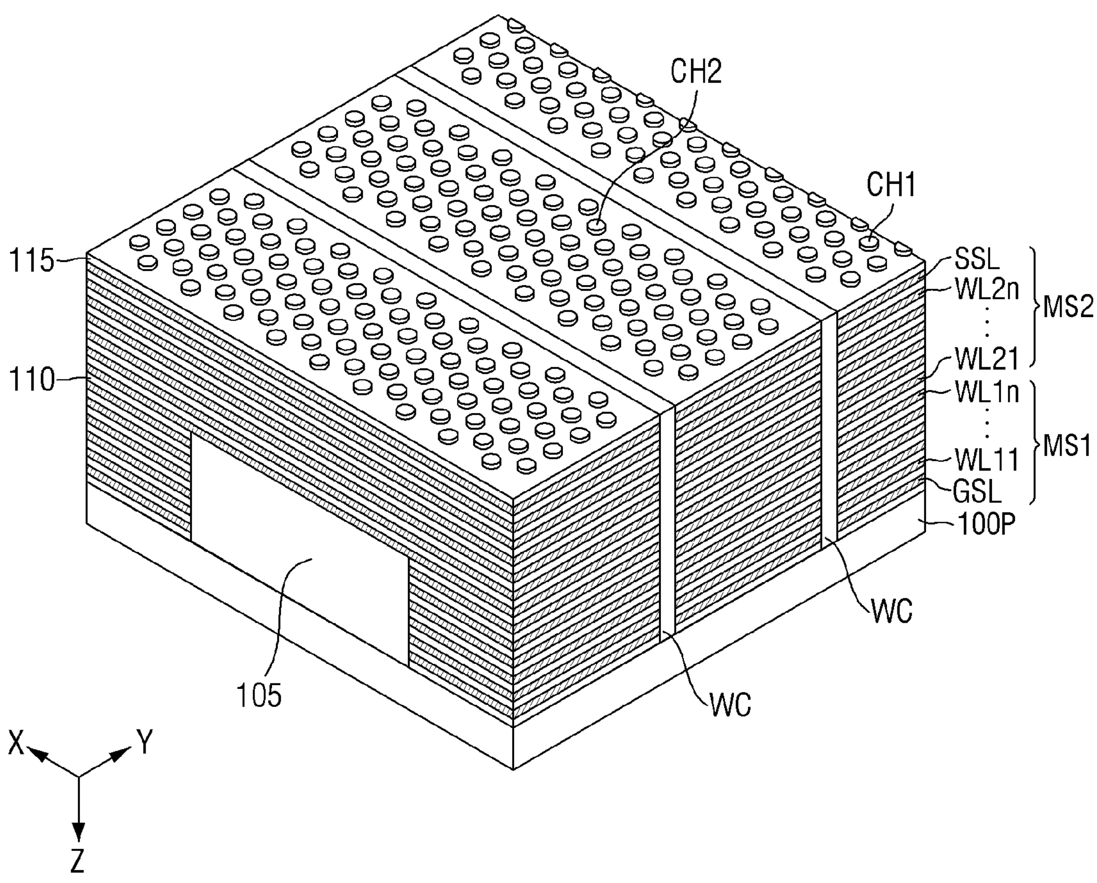

Referring to FIG. 28, a plurality of gate electrodes GSL, WL11 to WL1*n*, WL21 to WL2*n* and SSL are formed.

For example, the mold sacrificial layers 112 and 117 exposed by the word line cutting region WC may be selectively removed. Subsequently, the gate electrodes GSL, WL11 to WL1*n*, WL21 to WL2*n* and SSL that replace the region from which the mold sacrificial layers 112 and 117 are removed may be formed. As a result, a first mold stack MS1, which includes a plurality of first gate electrodes GSL and WL11 to WL1*n*, and a second mold stack MS2, which includes a plurality of second gate electrodes WL21 to WL2*n* and SSL, may be formed. After the first mold stack MS1 and the second mold stack MS2 are formed, the word line cutting region WC may be filled with an insulating material.

Figure 29:
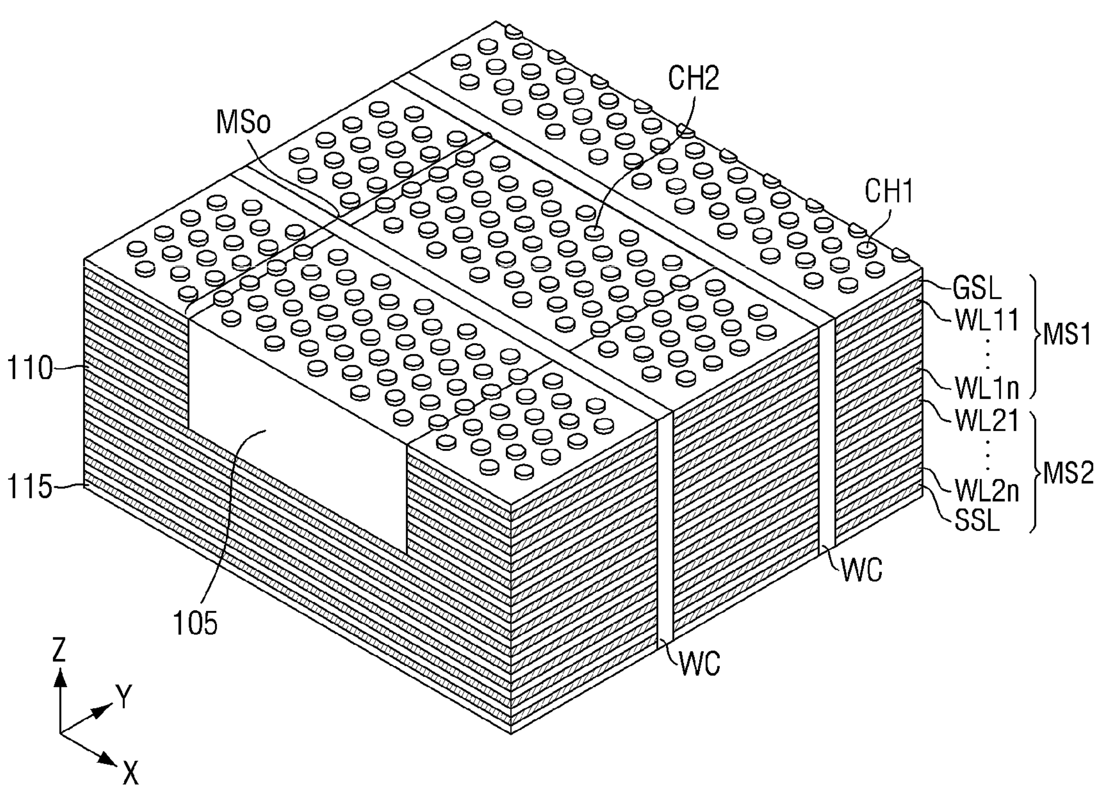

Referring to FIG. 29, one end of the first channel structure CH1 and/or one end of the second channel structure CH2 is exposed.

A planarization process or a recess process for a back side of the base substrate 100P may be performed. As a result, at least a portion of the base substrate 100P may be removed to expose one end of the first channel structure CH1 and/or one end of the second channel structure CH2. In some embodiments, the base substrate 100P may be completely removed.

Figure 30:
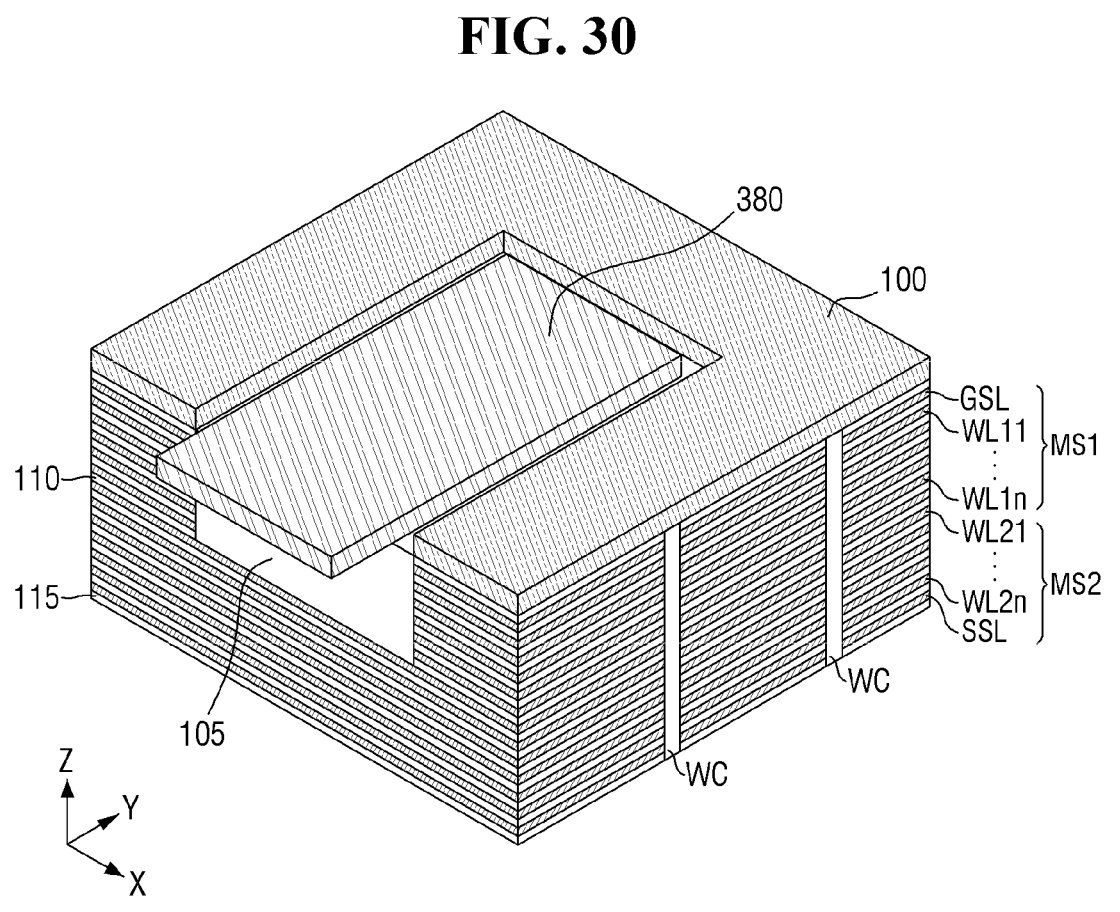

Referring to FIG. 30, a cell substrate 100 and an input/output pad 380 are formed.

The cell substrate 100 may be connected to one end of the first channel structure CH1 and/or one end of the second channel structure CH2. For example, the cell substrate 100 may be deposited on a surface (e.g., upper surface) of the first mold stack MS1 from which the base substrate 100P is removed. As a result, the cell substrate 100 connected to the first channel structure CH1 and/or the second channel structure CH2 may be formed. In some embodiments, the cell substrate 100 may include impurities. For example, the cell substrate 100 may include polysilicon (poly-Si) doped with impurities.

The cell substrate 100 may include a substrate opening 1000. The substrate opening 1000 may expose at least a portion of the mold opening MSo (or filling material layer 105) in plan view. For example, after the cell substrate 100 is deposited on the first mold stack MS1, a patterning process for the cell substrate 100 may be performed. As a result, the cell substrate 100 exposing at least a portion of the mold opening MSo (or filling material layer 105) may be formed.

Subsequently, an input/output pad 380 may be formed on the cell substrate 100. At least a portion of the input/output pad 380 may overlap the mold opening MSo (or filling material layer 105) in the third direction Z. In some embodiments, at least a portion of the input/output pad 380 may overlap both the mold opening MSo (or filling material layer 105) and the substrate opening 1000 (or insulating substrate 101) in the third direction Z.

As a result, the semiconductor memory device described with reference to FIG. 7 may be fabricated.

Figure 31:
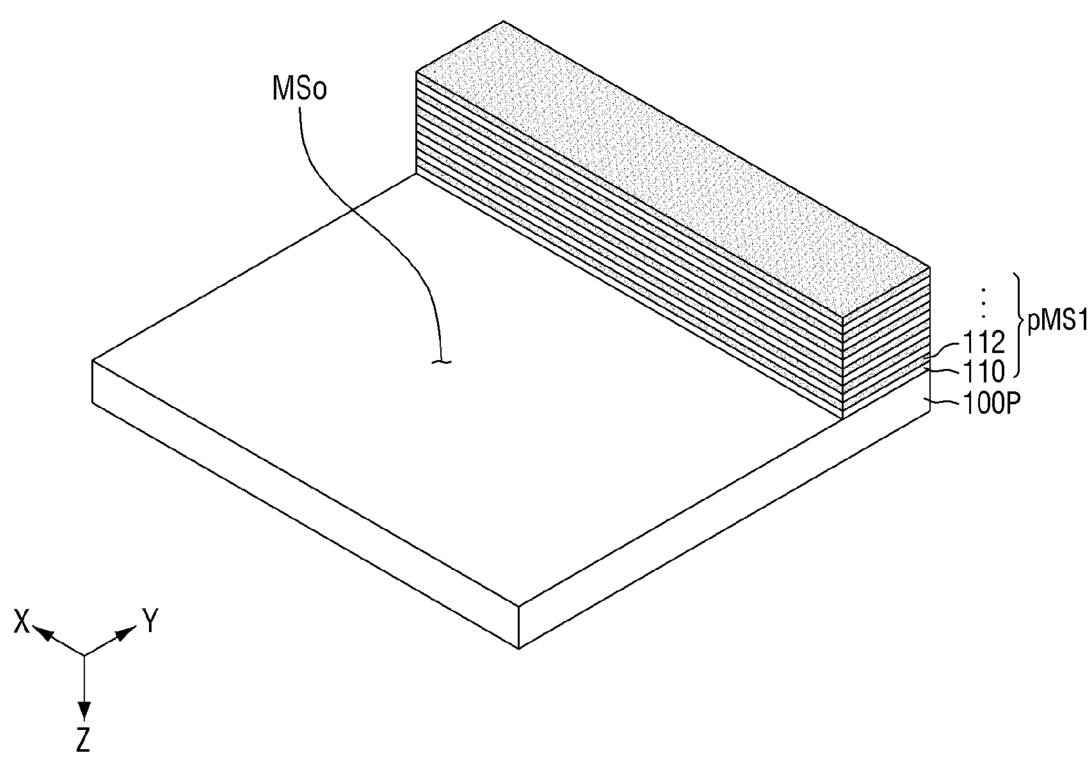
FIGS. 31 and 32 are views illustrating intermediate steps to describe a method for fabricating a semiconductor memory device according to some embodiments.
Figure 32:
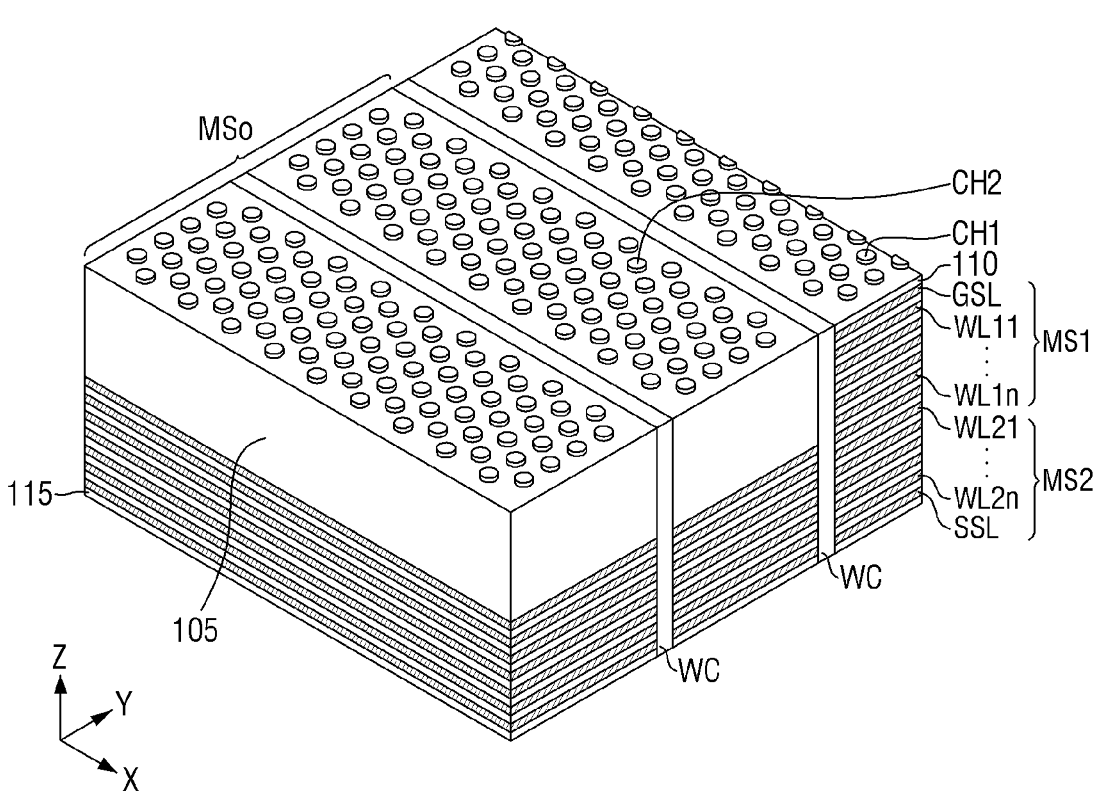

FIGS. 31 and 32 are views illustrating intermediate steps to describe a method for fabricating a semiconductor memory device according to some embodiments. For convenience of description, redundant portions of those described with reference to FIGS. 1 to 30 will be briefly described or omitted. For reference, FIG. 31 is a view illustrating intermediate steps to describe steps after FIG. 23.

Referring to FIG. 31, a mold opening MSo extending to be long in the first direction X is formed in a first pre-mold pMS1.

Subsequently, the steps described with reference to FIGS. 25 to 29 may be performed. Therefore, as shown in FIG. 32, a mold opening MSo (or filling material layer 105) that extends to be long in the first direction X may be formed in the mold structures MS1 and MS2.

Then, the step described with reference to FIG. 30 may be performed. As a result, the semiconductor memory device described with reference to FIG. 12 may be fabricated.

Figure 33:
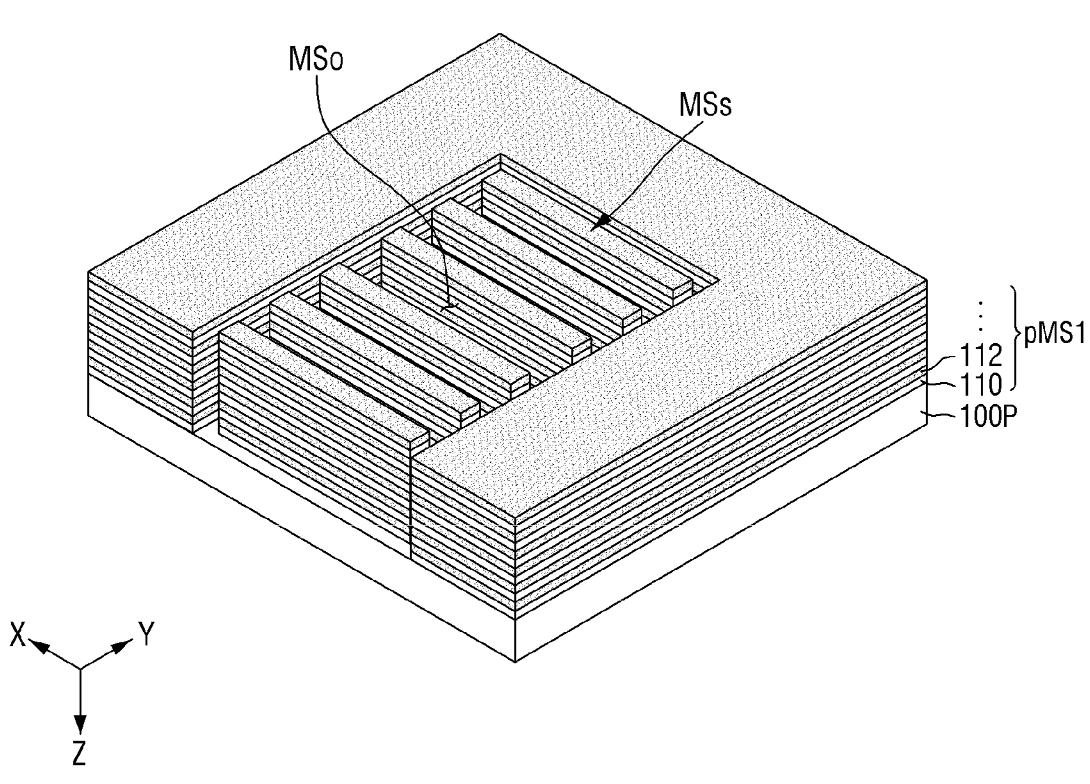
FIGS. 33 and 34 are views illustrating intermediate steps to describe a method for fabricating a semiconductor memory device according to some embodiments.
Figure 34:
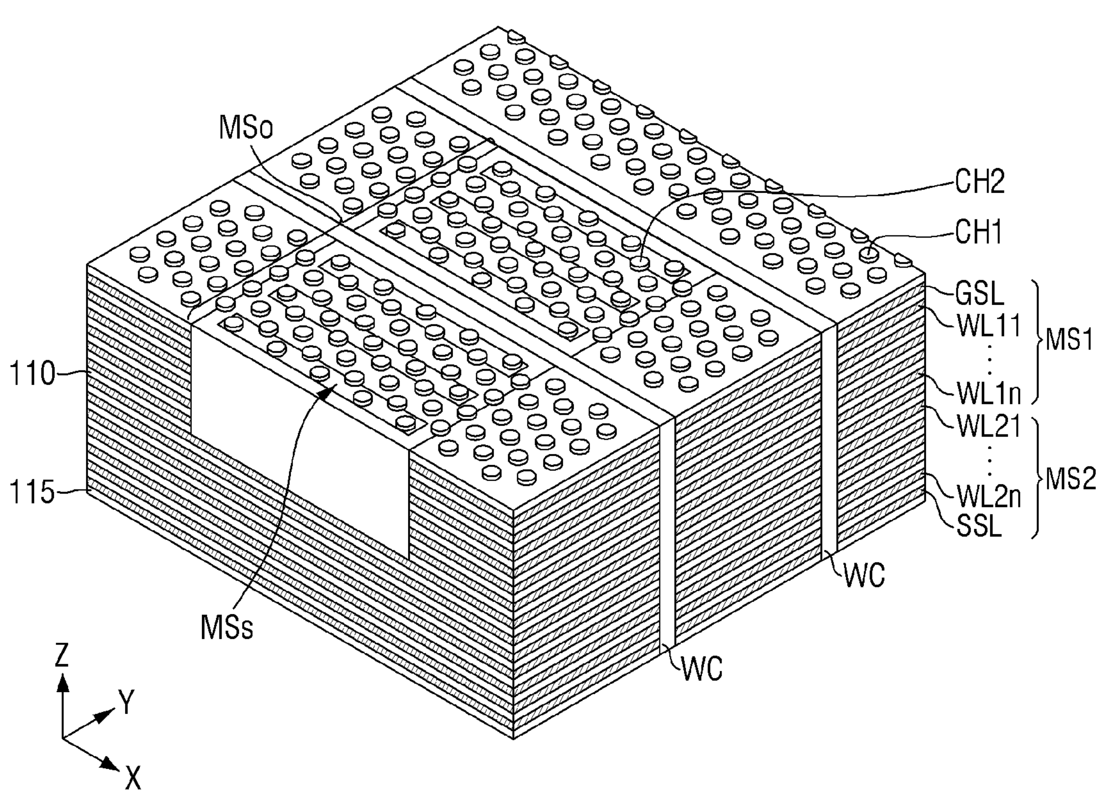

FIGS. 33 and 34 are views illustrating intermediate steps to describe a method for fabricating a semiconductor memory device according to some embodiments. For convenience of description, redundant portions of those described with reference to FIGS. 1 to 30 will be briefly described or omitted. For reference, FIG. 33 is a view illustrating intermediate steps to describe steps after FIG. 23.

Referring to FIG. 33, a mold opening MSo and a support stack MSs are formed in the first pre-mold pMS1.

The support stack MSs may be disposed in the mold opening MSo. For example, the support stack MSs may be a region where a portion of the first pre-mold pMS1 remains without being removed during a patterning process for forming the mold opening MSo. In this case, in the same manner as the first pre-mold pMS1, the support stack MSs may include first mold insulating layers 110 and first mold sacrificial layers 112, which are alternately stacked. The support stack MSs may improve flatness of the first pre-mold pMS1 and prevent collapse of the first pre-mold pMS1 from occurring in a subsequent process.

In some embodiments, the support stack MSs may be spaced apart from the first mold sacrificial layers 112 of the first pre-mold pMS1. Further, in some embodiments, the support stack MSs may be spaced apart from a word line cutting region WC formed in a subsequent process. In this case, unlike the first pre-mold pMS1, the first mold sacrificial layers 112 of the support stack MSs may not be replaced with the first gate electrodes GSL and WL11 to WL1*n*.

Subsequently, the steps described with reference to FIGS. 25 to 29 may be performed. As a result, as shown in FIG. 33, the mold opening MSo (or filling material layer 105) in which the support stack MSs is disposed may be formed.

Then, the step described with reference to FIG. 30 may be performed. As a result, the semiconductor memory device described with reference to FIG. 15 may be fabricated.

Hereinafter, an electronic system including a semiconductor memory device according to exemplary embodiments will be described with reference to FIGS. 1 to 22 and FIGS. 35 to 37.

Figure 35:
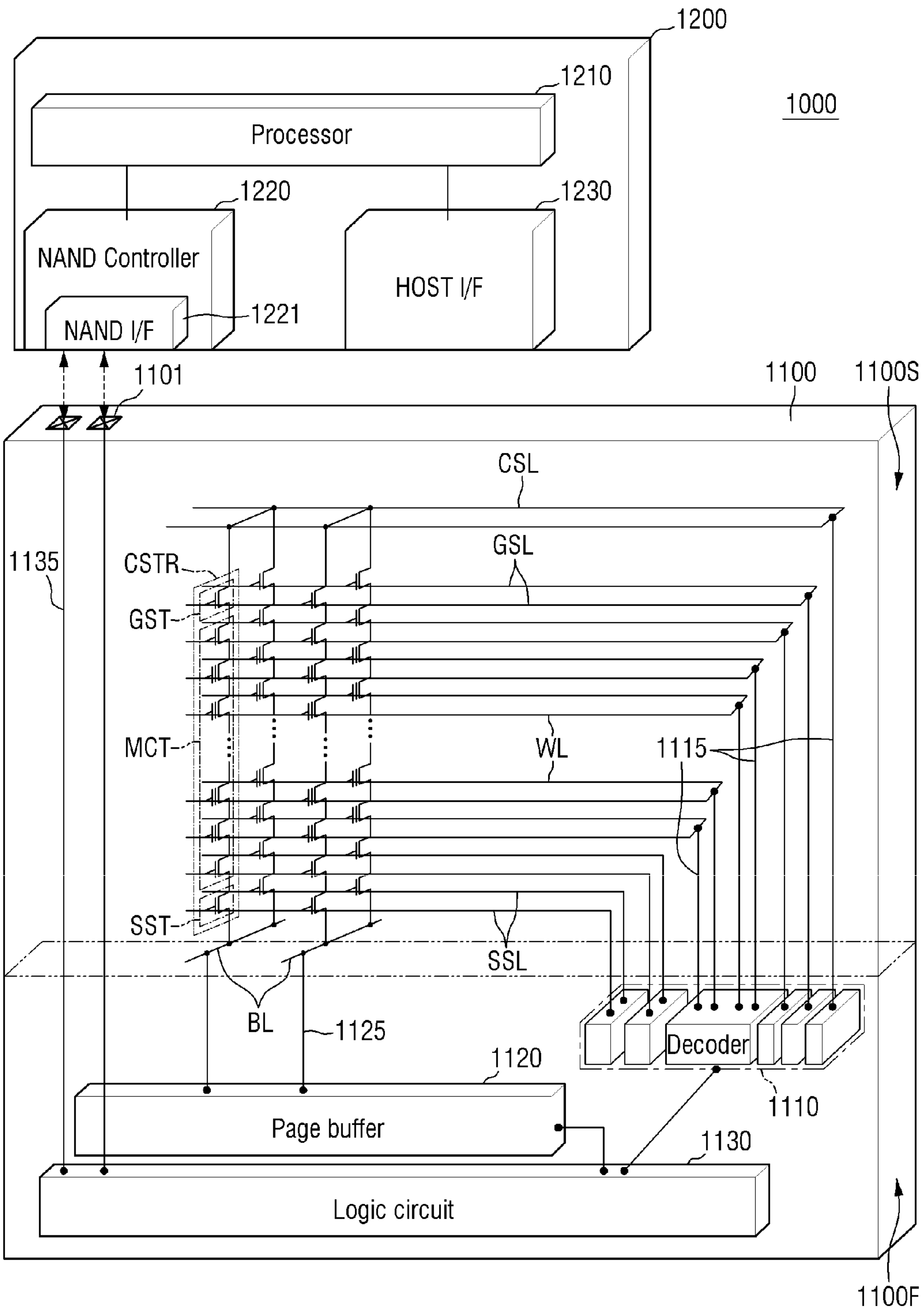
FIG. 35 is an exemplary block diagram illustrating an electronic system according to some embodiments.
Figure 37:
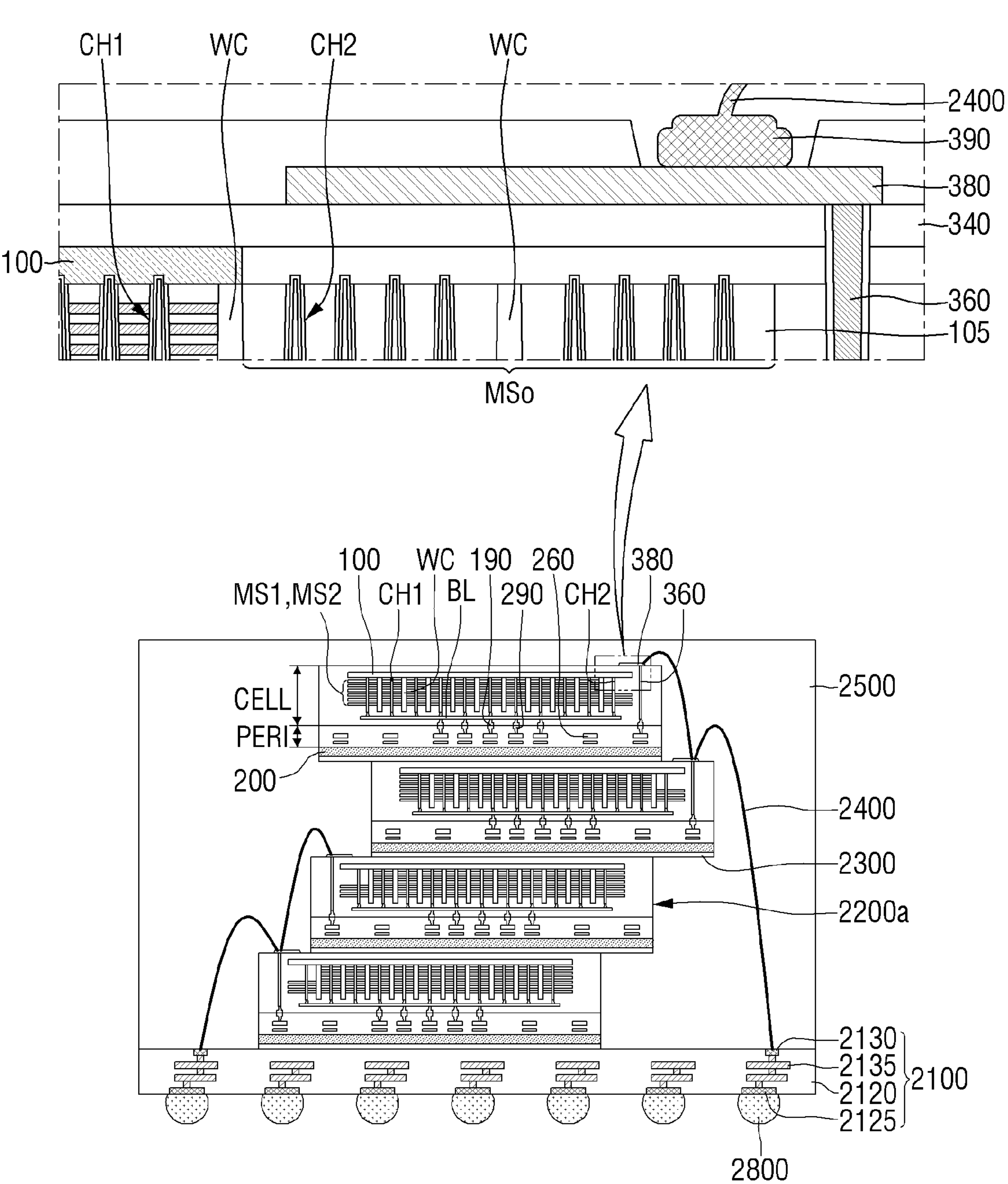
FIG. 37 is a schematic cross-sectional view taken along line I-I of FIG. 26.

FIG. 35 is an exemplary block diagram illustrating an electronic system according to some embodiments. FIG. 36 is an exemplary perspective view illustrating an electronic system according to some embodiments. FIG. 37 is a schematic cross-sectional view taken along line I-I of FIG. 36. For convenience of description, redundant portions of those described with reference to FIGS. 1 to 34 will be described briefly or omitted.

Referring to FIG. 35, an electronic system 1000 according to some embodiments may include a semiconductor memory device 1100 and a controller 1200 electrically connected to the semiconductor memory device 1100. The electronic system 1000 may be a storage device including one or a plurality of semiconductor memory devices 1100 or an electronic device including the storage device. For example, the electronic system 1000 may be a solid state drive (SSD) device, a universal serial bus (USB), a computing system, a medical device or a communication device, which includes one or more semiconductor memory devices 1100.

The semiconductor memory device 1100 may be a non-volatile memory device (e.g., NAND flash memory device), and may be, for example, the semiconductor memory device described with reference to FIGS. 1 to 22. The semiconductor memory device 1100 may include a first structure 1100F and a second structure 1100S on the first structure 1100F.

The first structure 1100F may be a peripheral circuit structure that includes a decoder circuit 1110 (e.g., row decoder 33 in FIG. 1), a page buffer 1120 (e.g., page buffer 35 in FIG. 1) and a logic circuit 1130 (e.g., control logic 37 in FIG. 1).

The second structure 1100S may include a common source line CSL, a plurality of bit lines BL and a plurality of cell strings CSTR, which are described above with reference to FIG. 2. The cell strings CSTR may be connected to the decoder circuit 1110 through a word line WL, at least one string selection line SSL and at least one ground selection line GSL. In addition, the cell strings CSTR may be connected to the page buffer 1120 through the bit lines BL. For example, the second structure 1100S may correspond to the cell structure CELL described above with reference to FIGS. 1 to 22.

In some embodiments, the common source line CSL and the cell strings CSTR may be electrically connected to the decoder circuit 1110 through first connection lines 1115 extending from the first structure 1100F to the second structure 1100S.

In some embodiments, the bit lines BL may be electrically connected to the page buffer 1120 through second connection lines 1125.

The semiconductor memory device 1100 may perform communication with the controller 1200 through an input/output pad 1101 electrically connected to the logic circuit 1130 (e.g., control logic 37 in FIG. 1). The input/output pad 1101 may correspond to the input/output pad 380 described with reference to FIGS. 1 to 22. The input/output pad 1101 may be electrically connected to the logic circuit 1130 through an input/output connection line 1135 extending from the first structure 1100F to the second structure 1100S. The connection line 1135 may correspond to the first contact plug 360 described above with reference to FIGS. 1 to 22.

The controller 1200 may include a processor 1210, a NAND controller 1220 and a host interface 1230. In some embodiments, the electronic system 1000 may include a plurality of semiconductor memory devices 1100, and in this case, the controller 1200 may control the plurality of semiconductor memory devices 1100.

The processor 1210 may control the overall operation of the electronic system 1000 including the controller 1200. The processor 1210 may operate in accordance with predetermined firmware, and may access the semiconductor memory device 1100 by controlling the NAND controller 1220. The NAND controller 1220 may include a NAND interface 1221 that processes communication with the semiconductor memory device 1100. A control command for controlling the semiconductor memory device 1100, data to be written in the memory cell transistors MCT of the semiconductor memory device 1100, data to be read from the memory cell transistors MCT of the semiconductor memory device 1100, etc. may be transmitted through the NAND interface 1221. The host interface 1230 may provide a communication function between the electronic system 1000 and an external host. When the control command is received from the external host through the host interface 1230, the processor 1210 may control the semiconductor memory device 1100 in response to the control command.

Referring to FIGS. 36 and 37, an electronic system according to some embodiments may include a main board 2001, a main controller 2002 packaged on the main board 2001, one or more semiconductor packages 2003 and a DRAM 2004. The semiconductor package 2003 and the DRAM 2004 may be connected to the main controller 2002 by wiring patterns 2005 formed in the main board 2001.

The main board 2001 may include a connector 2006 that includes a plurality of pins coupled to the external host. The number and arrangement of the plurality of pins in the connector 2006 may be varied depending on the communication interface between the electronic system 2000 and the external host. In some embodiments, the electronic system 2000 may perform communication with the external host in accordance with any one of interfaces such as a Universal Serial Bus (USB), a Peripheral Component Interconnect Express (PCI-Express), Serial Advanced Technology Attachment (SATA) and M-Phy for Universal Flash Storage (UFS). In some embodiments, the electronic system 2000 may operate by a power source supplied from the external host through the connector 2006. The electronic system 2000 may further include a power management integrated circuit (PMIC) that distributes the power source supplied from the external host to the main controller 2002 and the semiconductor package 2003.

The main controller 2002 may write data in the semiconductor package 2003 or read the data from the semiconductor package 2003, and may improve the operating speed of the electronic system 2000.

The DRAM 2004 may be a buffer memory for mitigating a speed difference between the semiconductor package 2003 that is a data storage space and the external host. Also, the DRAM 2004 included in the electronic system 2000 may operate as a kind of a cache memory, and may provide a space for temporarily storing data in a control operation for the semiconductor package 2003. When the DRAM 2004 is included in the electronic system 2000, the main controller 2002 may further include a DRAM controller for controlling the DRAM 2004, in addition to the NAND controller for controlling the semiconductor package 2003.

The semiconductor package 2003 may include a first semiconductor package **2003*a* and a second semiconductor package 2003*b*, which are spaced apart from each other. Each of the first semiconductor package 2003*a* and the second semiconductor package 2003*b* may be a semiconductor package that includes a plurality of semiconductor chips 2200. Each of the first semiconductor package 2003*a* and the second semiconductor package 2003*b* may include a package substrate 2100, semiconductor chips 2200 on the package substrate 2100, adhesive layers 2300 disposed on lower surfaces of the respective semiconductor chips 2200, a connection structure 2400 for electrically connecting the semiconductor chips 2200 with the package substrate 2100, and a molding layer 2500 covering the semiconductor chips 2200 and the connection structure 2400 on the package substrate 2100**.

The package substrate 2100 may be a printed circuit board that includes package upper pads 2130. Each semiconductor chip 2200 may include an input/output pad 380. The input/output pad 380 may correspond to the input/output pad 1101 of FIG. 35.

In some embodiments, the connection structure 2400 may be a bonding wire for electrically connecting the input/output pad 380 with the package upper pads 2130. For example, the connection structure 2400 may be connected to the input/output pad 380 by a bonding solder 390. Therefore, in each of the first semiconductor package 2003*a* and the second semiconductor package 2003*b*, the semiconductor chips 2200 may be electrically connected to each other in a bonding wire manner, and may be electrically connected to the package upper pads 2130 of the package substrate 2100. In some embodiments, in each of the first semiconductor package 2003*a* and the second semiconductor package 2003*b*, the semiconductor chips 2200 may be electrically connected to each other by a connection structure that includes a through silicon via TSV, instead of the connection structure 2400 of the bonding wire manner.

In some embodiments, the main controller 2002 and the semiconductor chips 2200 may be included in one package. In some embodiments, the main controller 2002 and the semiconductor chips 2200 may be packaged on a separate interposer substrate different from the main board 2001, and the main controller 2002 may be connected with the semiconductor chips 2200 by a wire formed in the interposer substrate.

In some embodiments, the package substrate 2100 may be a printed circuit board. The package substrate 2100 may include a package substrate body portion 2120, package upper pads 2130 disposed on an upper surface of the package substrate body portion 2120, lower pads 2125 disposed on a lower surface of the package substrate body portion 2120 or exposed through the lower surface, and internal wires 2135 electrically connecting the upper pads 2130 with the lower pads 2125 inside the package substrate body portion 2120. The upper pads 2130 may be electrically connected to the connection structures 2400. The lower pads 2125 may be connected to the wiring patterns 2005 of the main board 2001 of the electronic system 2000 through conductive connectors 2800 as shown in FIG. 37.

In the electronic system according to some embodiments, each of the semiconductor chips 2200 may include the semiconductor memory device described with reference to FIGS. 1 to 22. For example, each of the semiconductor chips 2200 may include a cell structure CELL, a peripheral circuit structure PERI, and an input/output pad 380. Illustratively, the peripheral circuit structure PERI may include the peripheral circuit substrate 200 and the peripheral circuit wiring structure 260, which are described with reference to FIG. 5. Also, the cell structure CELL may include the cell substrate 100, the mold structures MS1 the MS2, the filling material layer 105, the first channel structure CH1, the second channel structure CH2, the word line cutting region WC, the bit line BL, and the cell wiring structure 180, which are described with reference to FIGS. 4 to 7. The peripheral circuit structure PERI and the cell structure CELL may be bonded to each other through a first bonding metal 190 and a second bonding metal 290.

While the present inventive concept has been particularly shown and described with reference to exemplary embodiments thereof, it will be understood by those of ordinary skill in the art that various changes in form and details may be made therein without departing from the scope of the present inventive concept as defined by the following claims. It is therefore desired that the present embodiments be considered in all respects as illustrative and not restrictive, reference being made to the appended claims rather than the foregoing description to indicate the scope of the invention.

What is claimed is:

1. A semiconductor memory device comprising:
- a cell substrate including a first surface and a second surface opposite to the first surface;
- a first mold stack including a plurality of first gate electrodes sequentially stacked on the first surface;
- a second mold stack including a plurality of second gate electrodes sequentially stacked on the first mold stack;
- a first channel structure extending in a first direction crossing the first surface and crossing the plurality of first gate electrodes and the plurality of second gate electrodes; and
- an input/output pad on the second surface,
- wherein the first mold stack includes a mold opening that exposes a portion of the second mold stack, and
- at least a portion of the input/output pad overlaps the mold opening in the first direction.

2. The semiconductor memory device of claim 1, wherein the cell substrate includes a substrate opening that exposes at least a portion of the mold opening, and
- at least a portion of the input/output pad overlaps the substrate opening in the first direction.

3. The semiconductor memory device of claim 1, wherein one end of the first channel structure is electrically connected to the cell substrate.

4. The semiconductor memory device of claim 3, wherein the cell substrate includes polysilicon (poly-Si) doped with impurities.

5. The semiconductor memory device of claim 1, further comprising a second channel structure extending in the first direction to pass through the mold opening, crossing the plurality of second gate electrodes.

6. The semiconductor memory device of claim 1, further comprising:
- a cell wiring structure spaced apart from the cell substrate with the first and second mold stacks therebetween; and
- a contact plug extending in the first direction and electrically connecting the input/output pad with the cell wiring structure.

7. The semiconductor memory device of claim 6, wherein the contact plug does not overlap the mold opening in the first direction.

8. The semiconductor memory device of claim 6, wherein the contact plug passes through the mold opening and the second mold stack.

9. The semiconductor memory device of claim 1, wherein the first channel structure has a step difference at a boundary between the first mold stack and the second mold stack.

10. The semiconductor memory device of claim 1, further comprising a support stack including a mold insulating layer and a mold sacrificial layer, which are alternately stacked, in the mold opening.

11. The semiconductor memory device of claim 10, wherein the support stack is spaced apart from the plurality of first gate electrodes in a second direction crossing the first direction.

12. A semiconductor memory device comprising:
- a peripheral circuit structure; and
- a cell structure stacked on the peripheral circuit structure,
- wherein the cell structure includes:
  - a cell substrate including a first surface facing the peripheral circuit structure and a second surface opposite to the first surface;
  - a first mold stack and a second mold stack, which are sequentially stacked on the first surface, each of the first mold stack and the second mold stack including a plurality of gate electrodes;

a first channel structure extending in a first direction crossing the first surface and passing through the first mold stack and the second mold stack;

an input/output pad on the second surface; and a contact plug extending in the first direction to electrically connect the peripheral circuit structure with the input/output pad, wherein the first mold stack includes a mold opening that exposes a portion of the second mold stack, and wherein at least a portion of the input/output pad overlaps the mold opening in the first direction.

13. The semiconductor memory device of claim 12, wherein the cell substrate includes a substrate opening that exposes at least a portion of the mold opening, and at least a portion of the input/output pad overlaps the substrate opening in the first direction.

14. The semiconductor memory device of claim 12, further comprising a filling material layer in the first mold stack and in the mold opening.

15. The semiconductor memory device of claim 14, further comprising a second channel structure extending in the first direction to pass through the filling material layer and the second mold stack.

16. The semiconductor memory device of claim 12, further comprising an insulating spacer on sides of the contact plug.

17. The semiconductor memory device of claim 12, wherein the cell structure further includes:

a word line cutting region extending in a first direction crossing the first direction to cut the first mold stack and the second mold stack;

a bit line extending in a second direction crossing the first direction and the first direction and electrically connected to the first channel structure; and a cell wiring structure electrically connected to the plurality of gate electrodes, the bit line and the contact plug.

18. The semiconductor memory device of claim 17, wherein the peripheral circuit structure includes:

a peripheral circuit substrate facing the first surface;

a peripheral circuit element on the peripheral circuit substrate; and a peripheral circuit wiring structure electrically connected to the peripheral circuit element and bonded to the cell wiring structure.

19. An electronic system comprising:

a main board;

a semiconductor memory device including a peripheral circuit structure and a cell structure, which are sequentially stacked, on the main board; and a controller electrically connected with the semiconductor memory device on the main board, wherein the cell structure includes:

a cell substrate including a first surface facing the peripheral circuit structure and a second surface opposite to the first surface, a first mold stack and a second mold stack, which are sequentially stacked on the first surface, each of the first mold stack and the second mold stack including a plurality of gate electrodes, a first channel structure extending in a first direction crossing the first surface and passing through the first mold stack and the second mold stack, and an input/output pad electrically connected with the controller on the second surface, wherein the first mold stack includes a mold opening that exposes a portion of the second mold stack, and at least a portion of the input/output pad overlaps the mold opening in the first direction.

20. The electronic system of claim 19, wherein the input/output pad is electrically connected to the controller through a bonding wire.

* * * * *